(12) United States Patent
Matsubara et al.

(10) Patent No.: US 11,533,806 B2
(45) Date of Patent: Dec. 20, 2022

(54) HIGH-FREQUENCY MODULE, HIGH-FREQUENCY CIRCUIT, AND COMMUNICATION DEVICE

(71) Applicant: Murata Manufacturing Co., Ltd., Kyoto (JP)

(72) Inventors: Hiroshi Matsubara, Kyoto (JP); Masanori Kato, Kyoto (JP); Yukiteru Sugaya, Kyoto (JP); Syunsuke Kido, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/221,310

(22) Filed: Apr. 2, 2021

(65) Prior Publication Data

US 2021/0315096 A1    Oct. 7, 2021

(30) Foreign Application Priority Data

Apr. 3, 2020   (JP) .............................. JP2020-067940

(51) Int. Cl.
| | |
|---|---|
| H05K 1/02 | (2006.01) |
| H05K 1/11 | (2006.01) |
| H05K 1/18 | (2006.01) |

(52) U.S. Cl.
CPC ........... H05K 1/0219 (2013.01); H05K 1/113 (2013.01); H05K 1/181 (2013.01);
(Continued)

(58) Field of Classification Search
CPC ...... H05K 1/0219; H05K 1/113; H05K 1/181; H05K 2201/09609; H05K 2201/09672; H05K 2201/1006; H05K 1/0243
(Continued)

(56) References Cited

U.S. PATENT DOCUMENTS

| | | | |
|---|---|---|---|
| 6,388,545 B1 * | 5/2002 | Kawachi | H03H 9/1071 333/195 |
| 2007/0103257 A1 * | 5/2007 | Murata | H05K 1/181 333/185 |

(Continued)

FOREIGN PATENT DOCUMENTS

| | | |
|---|---|---|
| CN | 102246414 A | 11/2011 |
| CN | 108242582 A | 7/2018 |

(Continued)

*Primary Examiner* — Sherman Ng
(74) *Attorney, Agent, or Firm* — Pearne & Gordon LLP

(57) ABSTRACT

A filter includes a first input/output electrode and the second input/output electrode, and is arranged on a first main surface of a mounting substrate. The mounting substrate includes a first land electrode, a second land electrode, a ground terminal, and a plurality of via conductors. The first land electrode is connected to the first input/output electrode. The second land electrode is connected to the second input/output electrode. The ground terminal is located closer to a second main surface side than the first main surface in a thickness direction of the mounting substrate. The plurality of via conductors is arranged between the first main surface and the second main surface, and is connected to the ground terminal. The plurality of via conductors is located between the first land electrode and the second land electrode in a plan view from the thickness direction of the mounting substrate.

17 Claims, 16 Drawing Sheets

(52) U.S. Cl.
CPC .............. *H05K 2201/09609* (2013.01); *H05K 2201/09672* (2013.01); *H05K 2201/1006* (2013.01)

(58) Field of Classification Search
USPC ........................................................ 361/736
See application file for complete search history.

(56) References Cited

U.S. PATENT DOCUMENTS

| | | |
|---|---|---|
| 2011/0221542 A1 | 9/2011 | Kihara |
| 2017/0194939 A1 | 7/2017 | Mukai |
| 2019/0123772 A1 | 4/2019 | Nosaka |

FOREIGN PATENT DOCUMENTS

| | | |
|---|---|---|
| CN | 109417378 A | 3/2019 |
| CN | 110429920 A | 11/2019 |
| WO | 2016/056377 A1 | 4/2016 |

* cited by examiner

HIGH-FREQUENCY MODULE, HIGH-FREQUENCY CIRCUIT, AND COMMUNICATION DEVICE

CROSS REFERENCE TO RELATED APPLICATION

This application claims priority from Japanese Patent Application No. 2020-067940 filed on Apr. 3, 2020. The content of this application is incorporated herein by reference in its entirety.

BACKGROUND

The present disclosure relates generally to a high-frequency module, a high-frequency circuit, and a communication device, and more particularly, to a high-frequency module including a filter, a high-frequency circuit including the high-frequency module, and a communication device including the high-frequency circuit.

There has been known an existing demultiplexing device including a first filter chip and a second filter chip (see, for example, International Publication No. 2016/056377).

The demultiplexing device disclosed in International Publication No. 2016/056377 is a triplexer including a duplexer and a filter. The first filter chip includes a duplexer. The second filter chip includes a filter.

International Publication No. 2016/056377 discloses a schematic arrangement of a first filter chip and a second filter chip mounted on a circuit board.

In the high-frequency module, in a case where a mounting substrate and a filter mounted on the mounting substrate are included, filter characteristics of the filter may be deteriorated.

BRIEF SUMMARY

An advantage of some aspects of the disclosure is to provide a high-frequency module, a high-frequency circuit, and a communication device capable of improving the filter characteristics.

A high-frequency module according to an aspect of the present disclosure includes a mounting substrate and a filter. The mounting substrate has a first main surface and a second main surface facing each other. The filter includes a first input/output electrode and a second input/output electrode, and is arranged on the first main surface of the mounting substrate. The mounting substrate includes a first land electrode, a second land electrode, a ground terminal, and a plurality of via conductors. The first land electrode is connected to the first input/output electrode. The second land electrode is connected to the second input/output electrode. The ground terminal is located closer to the second main surface side than the first main surface in a thickness direction (a direction perpendicular to the first main surface of the mounting substrate) of the mounting substrate. The plurality of via conductors is arranged between the first main surface and the second main surface, and is connected to the ground terminal. The plurality of via conductors is located between the first land electrode and the second land electrode in a plan view parallel to the thickness direction.

A high-frequency circuit according to an aspect of the present disclosure includes the high-frequency module and an amplifier. The amplifier is connected to the filter of the high-frequency module.

A communication device according to an aspect of the present disclosure includes the high-frequency circuit and a signal processing circuit. The signal processing circuit performs signal processing on a high-frequency signal that passes through the filter of the high-frequency module.

Other features, elements, characteristics and advantages of the present disclosure will become more apparent from the following detailed description of embodiments of the present disclosure with reference to the attached drawings.

DETAILED DESCRIPTION

Figure 1:
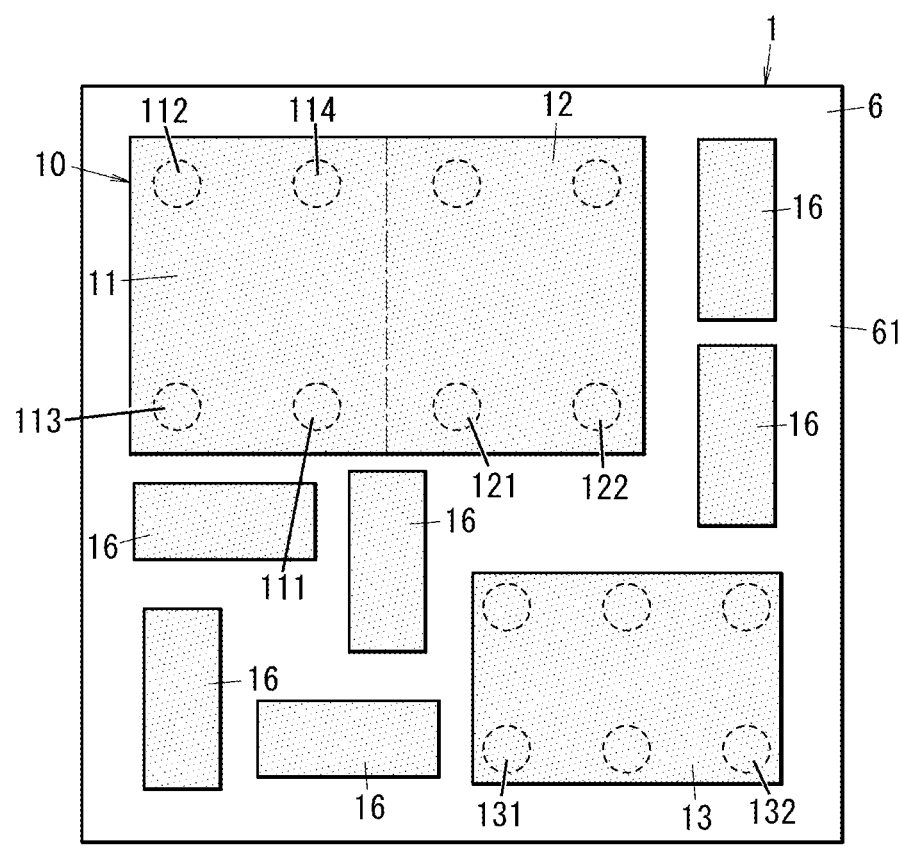
FIG. 1 is a plan view of a high-frequency module according to Embodiment 1.

FIGS. 1 to 6D, 15 to 18D, and 20 to 22 are referred to explain the following embodiments. Each of these drawings is a schematic diagram, and the ratio of the sizes and thicknesses of the respective constituent elements in the drawings does not necessarily reflect the actual dimensional ratio.

Embodiment 1

Hereinafter, a high-frequency module 1, a high-frequency circuit 2, and a communication device 300 according to Embodiment 1 will be described with reference to FIGS. 1 to 12.

1. Overview of High-Frequency Module

Figure 2:
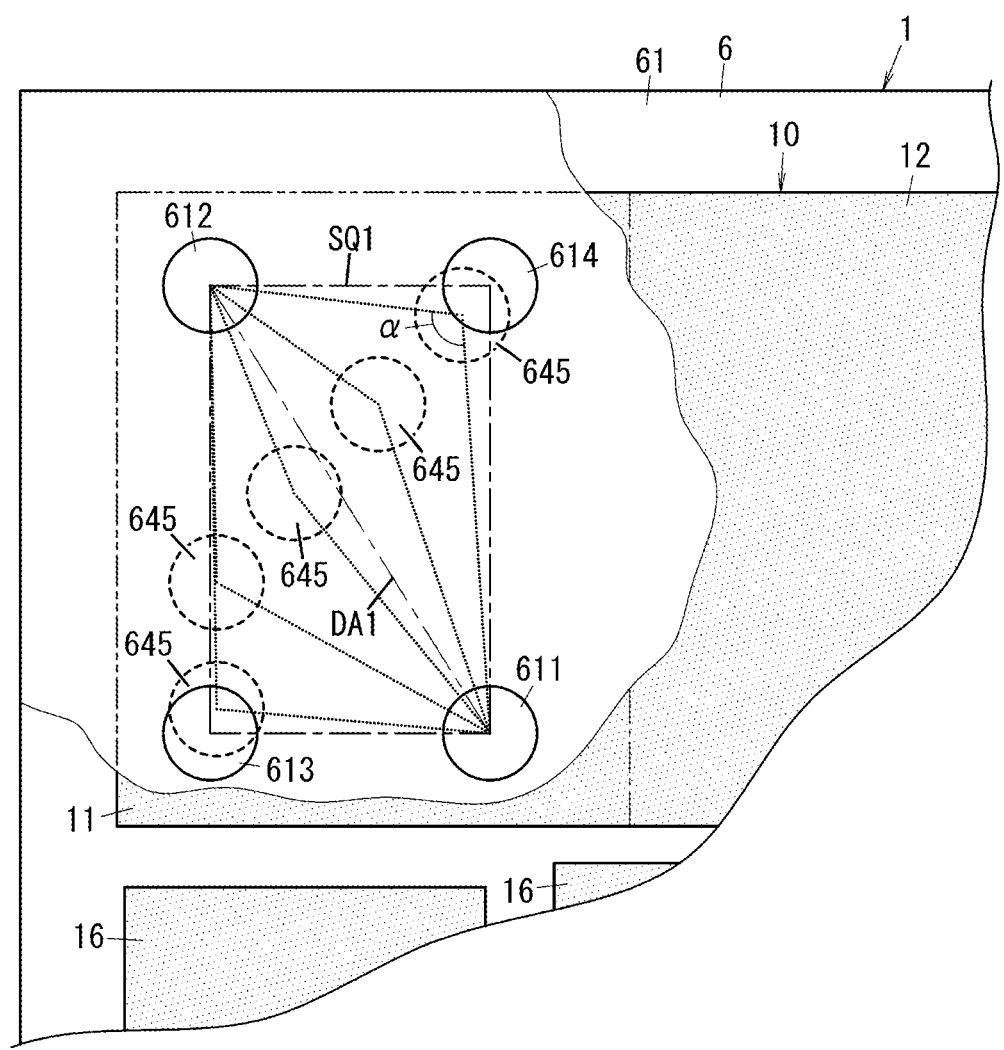
FIG. 2 is a plan view, partially broken out, of the above high-frequency module.
Figure 3:
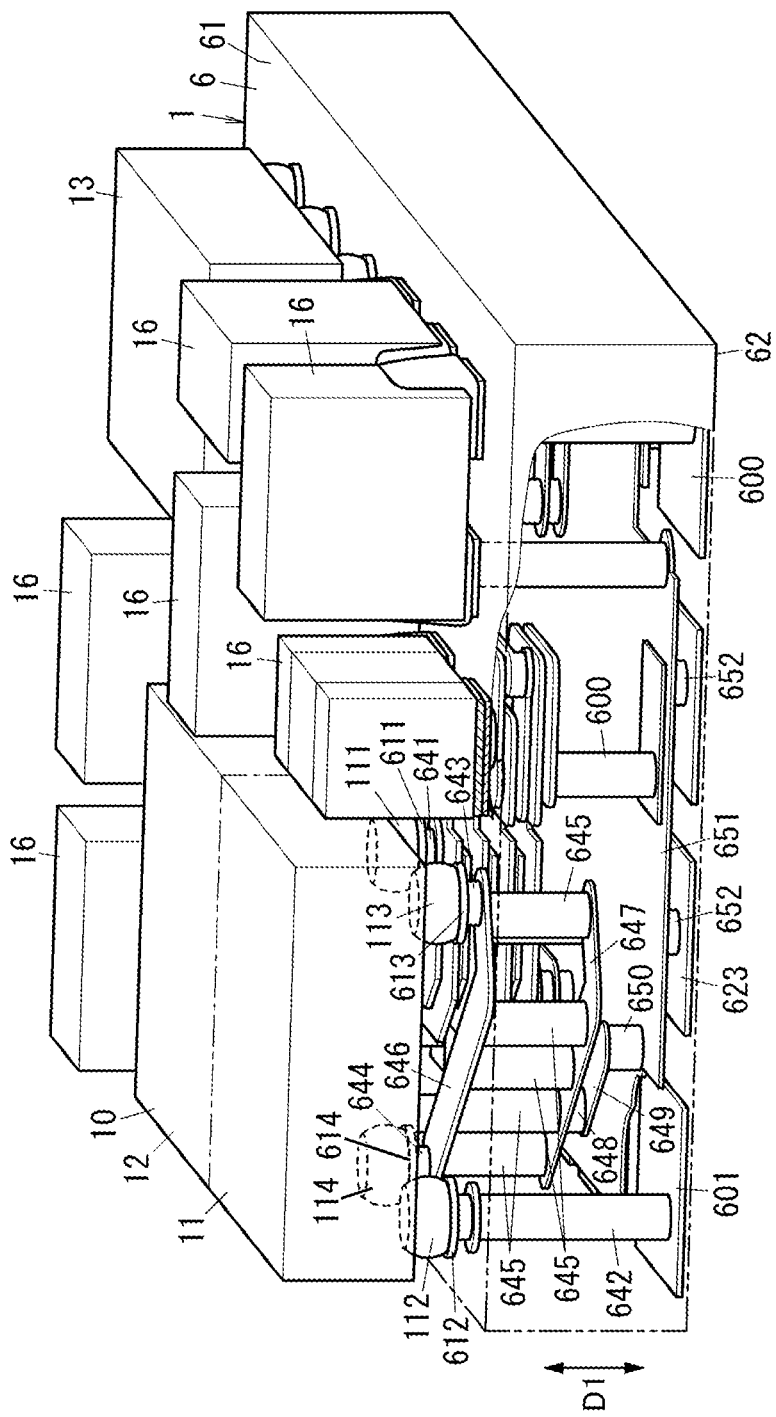
FIG. 3 is a perspective view illustrating the above high-frequency module partially in a see-through manner.
Figure 4:
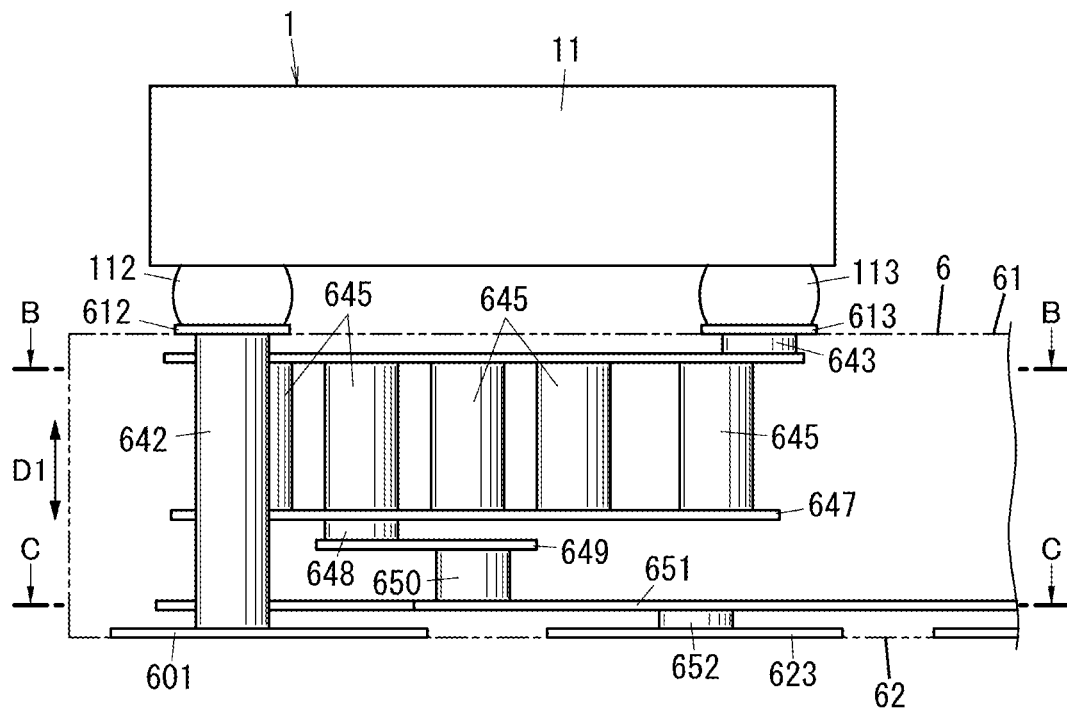
FIG. 4 is a perspective side view, partially broken out, of the above high-frequency module.
Figure 5:
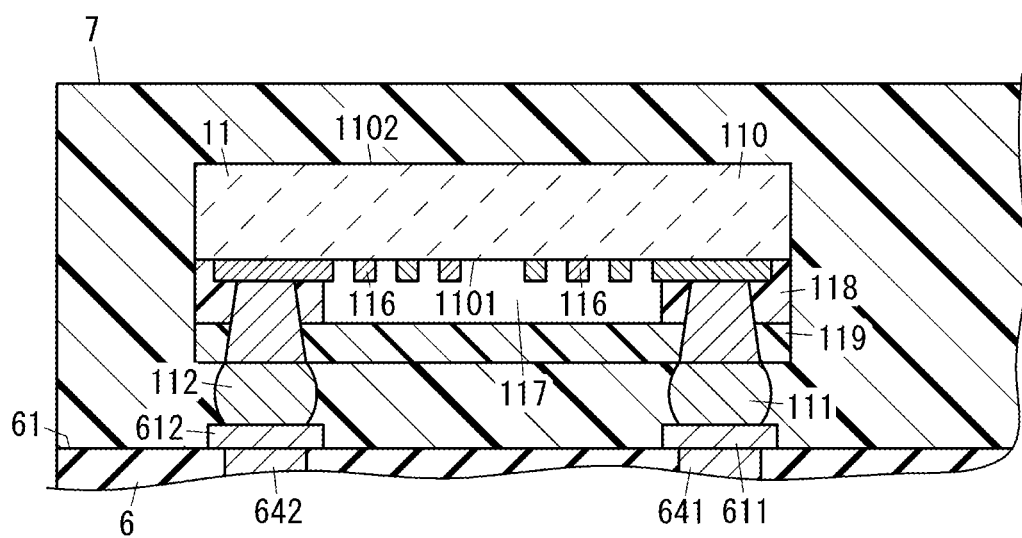
FIG. 5 is a cross-sectional view, partially broken out, of the above high-frequency module.

As illustrated in FIGS. 1 and 2, the high-frequency module 1 according to Embodiment 1 includes a mounting substrate 6 and a filter 11. As illustrated in FIGS. 3 to 5, the mounting substrate 6 has a first main surface 61 and a second main surface 62 that face each other. As illustrated in FIGS. 1 to 5, the filter 11 includes a first input/output electrode 111 and a second input/output electrode 112, and is arranged on the first main surface 61 of the mounting substrate 6.

As illustrated in FIG. 1, the first filter 11 includes, as a plurality of (four) external connection electrodes, the first input/output electrode 111, the second input/output electrode 112, and a plurality of (two) ground electrodes 113 and 114.

The filter 11 (hereinafter, also referred to as a first filter 11) is a band pass filter having a predetermined pass band. The predetermined pass band of the first filter 11 corresponds to a frequency band of the 2.4 GHz band of Wi-Fi®. The predetermined pass band is, for example, included in the frequency band of 2400 MHz to 2483 MHz.

The high-frequency module 1 further includes a second filter 12 in addition to the first filter 11. The second filter 12 is arranged on the first main surface 61 of the mounting substrate 6. In the high-frequency module 1 according to Embodiment 1, a filter device 10 including the first filter 11 and the second filter 12 is arranged on the first main surface 61 of the mounting substrate 6. The first filter 11 and the second filter 12 are provided as one package. The second filter 12 has a pass band on a lower frequency side than the predetermined pass band of the first filter 11, for example. The pass band on the lower frequency side than the predetermined pass band is included in, for example, the frequency band of 1710 MHz to 2370 MHz. The second filter 12 is, for example, a mid-band filter. The second filter 12 is, for example, a band elimination filter, has a stop band in the predetermined pass band of the first filter 11, and has a pass band also on a higher frequency side than the predetermined pass band of the first filter 11. The pass band on the higher frequency side than the predetermined pass band is included in, for example, the frequency band of 2496 MHz to 2690 MHz. The second filter 12 has only to have a pass band on at least one of the lower frequency side and the higher frequency side of the predetermined pass band of the first filter 11.

Figure 7:
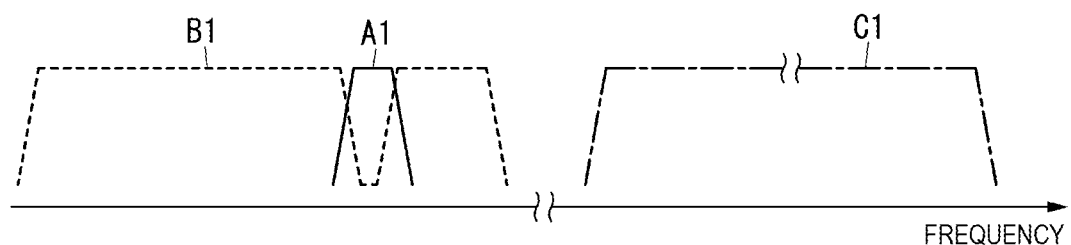
FIG. 7 is an explanatory diagram of filter bandpass characteristics of a first filter, a second filter, and a third filter in the above high-frequency module.

In addition, the high-frequency module 1 further includes a third filter 13. For example, the third filter 13 has a pass band on a higher frequency side than the predetermined pass band of the first filter 11. The third filter 13 is, for example, a filter for ultra-high band (UHB). The pass band of the third filter 13 is included in, for example, the frequency band of 3300 MHz to 5000 MHz. The pass band of the third filter 13 have only to be included in the frequency band of 3300 MHz to 5000 MHz, and for example, may be 3400 MHz to 3600 MHz. The pass band of the third filter 13 is located on the higher frequency side than the pass band of the second filter 12. In FIG. 7, the filter characteristics of the first filter 11 are schematically indicated by a solid line A1, the filter characteristics of the second filter 12 are indicated by a dashed line B1, and the filter characteristics of the third filter 13 are schematically indicated by a dashed-dotted line C1.

Figure 8:
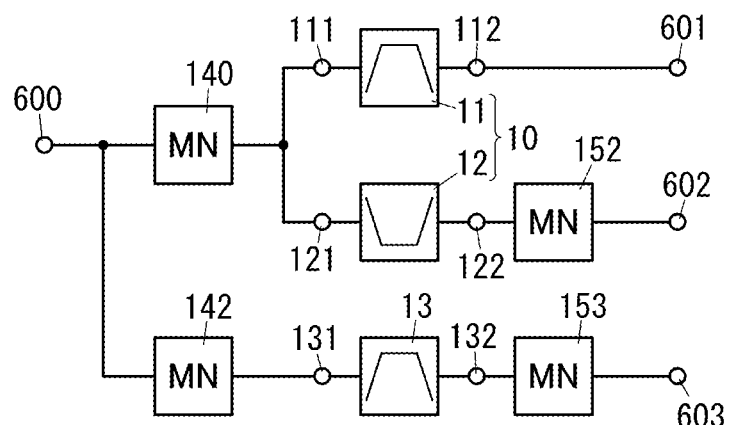
FIG. 8 is a circuit diagram of the above high-frequency module.

In the high-frequency module 1, one filter device 10 including the first filter 11 and the second filter 12 and the third filter 13 are mounted on the mounting substrate 6. As illustrated in FIG. 8, the high-frequency module 1 configures a multiplexer that includes the first filter 11, the second filter 12, and the third filter 13. Here, the second filter 12 includes an input/output electrode 121 and an input/output electrode 122. In addition, the third filter 13 includes an input/output electrode 131 and an input/output electrode 132. The high-frequency module 1 further includes a common terminal 600, a first terminal 601, a second terminal 602, and a third terminal 603. The common terminal 600 is a terminal to which the first input/output electrode 111 of the first filter 11, the input/output electrode 121 of the second filter 12, and the input/output electrode 131 of the third filter 13 are connected. The first terminal 601 is a terminal to which the second input/output electrode 112 of the first filter 11 is connected. The second terminal 602 is a terminal to which the input/output electrode 122 of the second filter 12 is connected. The third terminal 603 is a terminal to which the input/output electrode 132 of the third filter 13 is connected.

Additionally, as illustrated in FIG. 1, the high-frequency module 1 further includes a plurality of (six in the example of FIG. 1) electronic components 16 arranged on the first main surface 61 of the mounting substrate 6, in addition to the filter 11, the second filter 12, and the third filter 13. The plurality of electronic components 16 includes constituent elements (inductors, capacitors, and the like) of the plurality of (four) matching circuits 140, 142, 152, and 153 illustrated in FIG. 8. The matching circuit 140 is connected between the first input/output electrode 111 of the first filter 11 and the input/output electrode 121 of the second filter 12 and the common terminal 600. The matching circuit 142 is connected between the input/output electrode 131 of the third filter 13 and the common terminal 600. The matching circuit 152 is connected between the input/output electrode 122 of the second filter 12 and the second terminal 602. The matching circuit 153 is connected between the input/output electrode 132 of the third filter 13 and the third terminal 603.

The high-frequency module 1 according to Embodiment 1 includes the mounting substrate 6 and the filter 11. The mounting substrate 6 has the first main surface 61 and the second main surface 62 that face each other. The filter 11 includes the first input/output electrode 111 and the second input/output electrode 112, and is arranged on the first main surface 61 of the mounting substrate 6. The mounting substrate 6 includes a first land electrode 611, a second land electrode 612, a ground terminal 623, and a plurality of (for example, five) via conductors 645. The first land electrode 611 is connected to the first input/output electrode 111. The second land electrode 612 is connected to the second input/output electrode 112. The ground terminal 623 is located closer to the second main surface 62 side than the first main surface 61 in a thickness direction D1 of the mounting substrate 6. The plurality of via conductors 645 is arranged between the first main surface 61 and the second main surface 62, and is connected to the ground terminal 623. The plurality of via conductors 645 is located between the first land electrode 611 and the second land electrode 612 in a plan view from the thickness direction D1 of the mounting substrate 6 (see FIGS. 2 and 3). Accordingly, the high-frequency module 1 according to Embodiment 1 can improve the filter characteristics.

2. Overview of High-Frequency Circuit and Communication Device

Hereinafter, the high-frequency circuit 2 and the communication device 300 including the high-frequency module 1 according to Embodiment 1 will be described with reference to FIG. 12.

The high-frequency circuit 2 including the high-frequency module 1 is used, for example, in the multi-mode/multi-band compatible communication device 300. The communication device 300 is, for example, a mobile phone (e.g., a smartphone), but is not limited thereto, and may be, for example, a wearable terminal (e.g., a smart watch) or the like. The high-frequency module 1 is a module capable of coping with, for example, a 4G (fourth generation mobile communication) standard, a 5G (fifth generation mobile communication) standard, and the like. The 4G standard is, for example, the 3GPP LTE (Long Term Evolution) standard. The 5G standard is, for example, 5G NR (New Radio). The high-frequency circuit 2 is a circuit capable of supporting carrier aggregation and dual connectivity.

The high-frequency module 1 will be described in more detail after describing the high-frequency circuit 2 and the communication device 300.

The high-frequency circuit 2 is configured to amplify a transmission signal (high-frequency signal) input from a signal processing circuit 301, for example, and output the amplified signal to an antenna 310. The high-frequency circuit 2 is configured to amplify a reception signal (high-frequency signal) input from the antenna 310 and output the amplified signal to the signal processing circuit 301. The signal processing circuit 301 is a constituent element of the communication device 300 including the high-frequency circuit 2, instead of the constituent element of the high-frequency circuit 2. The high-frequency circuit 2 is controlled by, for example, the signal processing circuit 301 included in the communication device 300. The communication device 300 includes the high-frequency circuit 2 and the signal processing circuit 301. The communication device 300 further includes the antenna 310.

The signal processing circuit 301 includes, for example, an RF signal processing circuit 302 and a baseband signal processing circuit 303. The RF signal processing circuit 302 is, for example, a radio frequency integrated circuit (RFIC), and performs signal processing on a high-frequency signal. The RF signal processing circuit 302 performs signal processing, such as upconversion on a high-frequency signal (transmission signal) output from the baseband signal processing circuit 303, and outputs the high-frequency signal subjected to the signal processing. Further, the RF signal processing circuit 302 performs signal processing, such as down-conversion on a high-frequency signal (reception signal) output from the high-frequency module 1, and outputs the high-frequency signal subjected to the signal processing to the baseband signal processing circuit 303. The baseband signal processing circuit 303 is, for example, a baseband integrated circuit (BBIC). The baseband signal processing circuit 303 generates an I-phase signal and a Q-phase signal from the baseband signal. The baseband signal is, for example, an audio signal, an image signal, or the like input from the outside. The baseband signal processing circuit 303 performs an IQ modulation processing by combining the I-phase signal and the Q-phase signal, and outputs a transmission signal. At this time, the transmission signal is generated as a modulated signal (IQ signal) obtained by performing amplitude modulation on a carrier signal having a predetermined frequency at a cycle longer than a cycle of the carrier signal. The reception signal processed by the baseband signal processing circuit 303 is used for image display as an image signal, for example, or for audio communication as an audio signal. The high-frequency module 1 transmits a high-frequency signal (a reception signal, a transmission signal) between the antenna 310 and the RF signal processing circuit 302 of the signal processing circuit 301.

The high-frequency circuit 2 includes the high-frequency module 1 that configures a multiplexer, a first transmission/reception circuit 20, a second transmission/reception circuit 30, and a third transmission/reception circuit 40. The plurality of external connection terminals includes an antenna terminal and eight signal terminals T2 to T9.

In the high-frequency circuit 2, the common terminal 600 of the high-frequency module 1 is connected to an antenna terminal T1. The antenna terminal T1 is connected to the antenna 310.

The first transmission/reception circuit 20 is connected to the antenna terminal T1 via the first filter 11 of the high-frequency module 1. The first transmission/reception circuit 20 includes a first switch 21, a transmission filter 22, a reception filter 23, a power amplifier 24, and a low-noise amplifier 25.

The first switch 21 includes a common terminal 211 and a plurality of (two in the illustrated example) selection terminals 212 and 213. The common terminal 211 is connected to (the second input/output electrode 112 of) the first filter 11. The selection terminal 212 is connected to the transmission filter 22. The selection terminal 213 is connected to the reception filter 23.

The first switch 21 is a switch that allows one or more of the plurality of selection terminals 212 and 213 to be connected to the common terminal 211.

The first switch 21 is controlled by, for example, the signal processing circuit 301. The first switch 21 is compliant with, for example, the MIPI (Mobile Industry Processor Interface) standard. The first switch 21 switches the connection state between the common terminal 211 and the plurality of selection terminals 212 and 213 in accordance with the control signal from the RF signal processing circuit 302 of the signal processing circuit 301, for example. The first switch 21 is, for example, a switch IC (Integrated Circuit).

The transmission filter 22 allows a transmission signal (high-frequency signal) from the RF signal processing circuit 302 to pass therethrough.

The reception filter 23 allows the reception signal (high-frequency signal) received by the antenna 310 and passed through the first filter 11 to pass therethrough.

The power amplifier 24 has an input terminal and an output terminal. The input terminal of the power amplifier 24 is connected to the signal terminal T2. The output terminal of the power amplifier 24 is connected to the transmission filter 22. The signal terminal T2 is, for example, a terminal for inputting a transmission signal from an external circuit (for example, the signal processing circuit 301), and is connected to the signal processing circuit 301. The power amplifier 24 amplifies and outputs a transmission signal (high-frequency signal) from the signal processing circuit 301, for example.

The first transmission/reception circuit 20 may include an output matching circuit that is connected between the output terminal of the power amplifier 24 and the transmission filter 22. The output matching circuit is a circuit for performing impedance matching between the power amplifier 24 and the transmission filter 22.

The low-noise amplifier 25 has an input terminal and an output terminal. The input terminal of the low-noise amplifier 25 is connected to the reception filter 23. The output terminal of the low-noise amplifier 25 is connected to the signal terminal T3. The signal terminal T3 is, for example, a terminal for outputting a high-frequency signal (reception signal) from the low-noise amplifier 25 to an external circuit (for example, the signal processing circuit 301), and is connected to the signal processing circuit 301. The low-noise amplifier 25 amplifies the reception signal input to the input terminal, and outputs the amplified signal from the output terminal.

The first transmission/reception circuit 20 may include an input matching circuit connected between the reception filter 23 and the input terminal of the low-noise amplifier 25. The input matching circuit is a circuit for performing impedance matching between the reception filter 23 and the low-noise amplifier 25.

The second transmission/reception circuit 30 is connected to the antenna terminal T1 via the second filter 12 of the high-frequency module 1. The second transmission/reception circuit 30 includes a second switch 31, duplexers 32, 33, and 34, a third switch 35, a fourth switch 36, a power amplifier 37, and a low-noise amplifier 38.

The second switch 31 includes a common terminal 311 and a plurality of (three in the illustrated example) selection terminals 312, 313, and 314. The common terminal 311 is connected to the second filter 12. The selection terminal 312 is connected to the duplexer 32. The selection terminal 313 is connected to the duplexer 33. The selection terminal 314 is connected to the duplexer 34.

The second switch 31 is, for example, a switch capable of connecting at least one or more terminals among the three selection terminals 312, 313, and 314 to the common terminal 311. Here, the second switch 31 is, for example, a switch capable of performing a one-to-one connection and a one-to-many connection. The second switch 31 is compliant with, for example, the MIPI standard. The second switch 31 switches the connection state between the common terminal 311 and the three selection terminals 312, 313, and 314 in accordance with the control signal from the signal processing circuit 301, for example. The second switch 31 is, for example, a switch IC.

The third switch 35 includes a common terminal 351 and a plurality of (three in the illustrated example) selection terminals 352, 353, and 354. The common terminal 351 is electrically connected to the power amplifier 37. The selection terminal 352 is connected to the duplexer 32. The selection terminal 353 is connected to the duplexer 33. The selection terminal 354 is connected to the duplexer 34.

The third switch 35 is, for example, a switch capable of connecting at least one or more terminals among the three selection terminals 352, 353, and 354 to the common terminal 351. Here, the third switch 35 is, for example, a switch capable of performing a one-to-one connection and a one-to-many connection. The third switch 35 is compliant with, for example, the MIPI standard. The third switch 35 switches the connection state between the common terminal 351 and the three selection terminals 352, 353, and 354 in accordance with the control signal from the signal processing circuit 301, for example. The third switch 35 is, for example, a switch IC.

The fourth switch 36 includes a common terminal 361 and a plurality of (three in the illustrated example) selection terminals 362, 363, and 364. The common terminal 361 is electrically connected to the low-noise amplifier 38. The selection terminal 362 is connected to the duplexer 32. The selection terminal 363 is connected to the duplexer 33. The selection terminal 364 is connected to the duplexer 34.

The fourth switch 36 is, for example, a switch capable of connecting at least one or more terminals among the three selection terminals 362, 363, and 364 to the common terminal 361. Here, the fourth switch 36 is, for example, a switch capable of performing a one-to-one connection and a one-to-many connection. The fourth switch 36 is compliant with, for example, the MIPI standard. The fourth switch 36 switches the connection state between the common terminal 361 and the three selection terminals 362, 363, and 364 in accordance with the control signal from the signal processing circuit 301, for example. The fourth switch 36 is, for example, a switch IC.

Each of the plurality of duplexers 32 to 34 has a transmission filter, a reception filter, a common terminal, a transmission terminal, and a reception terminal. In each of the plurality of duplexers 32 to 34, the transmission filter is connected between the common terminal and the transmission terminal. In each of the plurality of duplexers 32 to 34, the reception filter is connected between the common terminal and the reception terminal. The common terminals of the plurality of duplexers 32 to 34 are connected to the plurality of selection terminals 312 to 314 of the second switch 31 in a one-to-one manner. Further, the transmission terminals of the plurality of duplexers 32 to 34 are connected to the plurality of (three in the illustrated example) selection terminals 352 to 354 of the third switch 35 in a one-to-one manner. The reception terminals of the plurality of duplexers 32 to 34 are connected to the plurality of selection terminals 362 to 364 of the fourth switch 36 in a one to-one manner. The pass bands of the transmission filters of the plurality of duplexers 32 to 34 are different from one another. The pass bands of the reception filters of the plurality of duplexers 32 to 34 are different from one another.

The power amplifier 37 has an input terminal and an output terminal. The input terminal of the power amplifier 37 is connected to the signal terminal T4. The output terminal of the power amplifier 37 is connected to the common terminal 351 of the third switch 35. The signal terminal T4 is, for example, a terminal for inputting a transmission signal from an external circuit (for example, the signal processing circuit 301), and is connected to the signal processing circuit 301. The power amplifier 37 amplifies and outputs a transmission signal (high-frequency signal) from the signal processing circuit 301, for example.

The second transmission/reception circuit 30 may include an output matching circuit connected between the output terminal of the power amplifier 37 and the common terminal 351 of the third switch 35. The output matching circuit is a circuit for performing impedance matching between the power amplifier 37 and the third switch 35.

The low-noise amplifier 38 has an input terminal and an output terminal. The input terminal of the low-noise amplifier 38 is connected to the common terminal 361 of the fourth switch 36. The output terminal of the low-noise amplifier 38 is connected to the signal terminal T5. The signal terminal T3 is, for example, a terminal for outputting a high-frequency signal (reception signal) from the low-noise amplifier 38 to an external circuit (for example, the signal processing circuit 301), and is connected to the signal processing circuit 301. The low-noise amplifier 38 amplifies the reception signal input to the input terminal, and outputs the amplified signal from the output terminal.

The second transmission/reception circuit 30 may include an input matching circuit connected between the common terminal 361 of the fourth switch 36 and the input terminal of the low-noise amplifier 38. The input matching circuit is a circuit for performing impedance matching between the fourth switch 36 and the low-noise amplifier 38.

The third transmission/reception circuit 40 is connected to the antenna terminal T1 via the third filter 13 of the high-frequency module 1. The third transmission/reception circuit 40 includes a diplexer 41, a transmission filter 44, a reception filter 45, a transmission filter 46, a reception filter 47, a fifth switch 42, a sixth switch 43, two power amplifiers 48 and 50, and two low-noise amplifiers 49 and 51.

The diplexer 41 includes a first transmission/reception filter, a second transmission/reception filter, a common terminal, a first transmission/reception terminal, and a second transmission/reception terminal. In the diplexer 41, the first transmission/reception filter is connected between the common terminal and the first transmission/reception terminal. In the diplexer 41, the second transmission/reception filter is connected between the common terminal and the second transmission/reception terminal.

The fifth switch 42 includes a common terminal 421 and a plurality of (two in the illustrated example) selection terminals 422 and 423. The common terminal 421 is connected to the first transmission/reception terminal of the diplexer 41. The selection terminal 422 is connected to the transmission filter 44. The selection terminal 423 is connected to the reception filter 45.

The fifth switch 42 is, for example, a switch capable of connecting one selection terminal of the two selection terminals 422 and 423 to the common terminal 421. The fifth switch 42 is compliant with, for example, the MIPI standard. The fifth switch 42 switches the connection state between the common terminal 421 and the two selection terminals 422 and 423 in accordance with the control signal from the signal processing circuit 301, for example. The fifth switch 42 is, for example, a switch IC.

The sixth switch 43 includes a common terminal 431 and a plurality of (two in the illustrated example) selection terminals 432 and 433. The common terminal 431 is connected to the second transmission/reception terminal of the diplexer 41. The selection terminal 432 is connected to the transmission filter 46. The selection terminal 433 is connected to the reception filter 47.

The sixth switch 43 is, for example, a switch capable of connecting one selection terminal of the two selection terminals 432 and 433 to the common terminal 431. The sixth switch 43 is compliant with, for example, the MIPI standard. The sixth switch 43 switches the connection state between the common terminal 431 and the two selection terminals 432 and 433 in accordance with the control signal from the signal processing circuit 301, for example. The sixth switch 43 is, for example, a switch IC.

The transmission filter 44 allows a transmission signal (high-frequency signal) output from the RF signal processing circuit 302 and amplified by the power amplifier 48 to pass therethrough. The transmission filter 46 allows a transmission signal (high-frequency signal) output from the RF signal processing circuit 302 and amplified by the power amplifier 48 to pass therethrough. The transmission filter 44 and the transmission filter 46 have pass bands different from each other.

The reception filter 45 allows a reception signal (high-frequency signal) received by the antenna 310 and passed through the third filter 13 and the first transmission/reception filter of the diplexer 41 to pass therethrough. The reception filter 47 passes a reception signal (high-frequency signal) received by the antenna 310 and passed through the third filter 13 and the second transmission/reception filter of the diplexer 41 to pass therethrough.

The power amplifier 48 has an input terminal and an output terminal. The input terminal of the power amplifier 48 is connected to the signal terminal T6. The output terminal of the power amplifier 48 is connected to the transmission filter 44. The signal terminal T6 is, for example, a terminal for inputting a transmission signal from an external circuit (for example, the signal processing circuit 301), and is connected to the signal processing circuit 301. The power amplifier 48 amplifies and outputs a transmission signal (high-frequency signal) from the signal processing circuit 301, for example.

The third transmission/reception circuit 40 may include an output matching circuit that is connected between the output terminal of the power amplifier 48 and the transmission filter 44. The output matching circuit is a circuit for performing impedance matching between the power amplifier 48 and the transmission filter 44.

The power amplifier 50 has an input terminal and an output terminal. The input terminal of the power amplifier 50 is connected to the signal terminal T8. The output terminal of the power amplifier 50 is connected to the transmission filter 46. The signal terminal T8 is, for example, a terminal for inputting a transmission signal from an external circuit (for example, the signal processing circuit 301), and is connected to the signal processing circuit 301. The power amplifier 50 amplifies and outputs a transmission signal (high-frequency signal) from the signal processing circuit 301, for example.

The third transmission/reception circuit 40 may include an output matching circuit that is connected between the output terminal of the power amplifier 50 and the transmission filter 46. The output matching circuit is a circuit for performing impedance matching between the power amplifier 50 and the transmission filter 46.

The low-noise amplifier 49 has an input terminal and an output terminal. The input terminal of the low-noise amplifier 49 is connected to the reception filter 45. The output terminal of the low-noise amplifier 49 is connected to the signal terminal T7. The signal terminal T7 is, for example, a terminal for outputting a high-frequency signal (reception signal) from the low-noise amplifier 49 to an external circuit (for example, the signal processing circuit 301), and is connected to the signal processing circuit 301. The low-noise amplifier 49 amplifies the reception signal input to the input terminal, and outputs the amplified signal from the output terminal.

The third transmission/reception circuit 40 may include an input matching circuit connected between the reception filter 45 and the input terminal of the low-noise amplifier 49. The input matching circuit is a circuit for performing impedance matching between the reception filter 45 and the low-noise amplifier 49.

The low-noise amplifier 51 has an input terminal and an output terminal. The input terminal of the low-noise amplifier 51 is connected to the reception filter 47. The output terminal of the low-noise amplifier 51 is connected to the signal terminal T9. The signal terminal T9 is, for example, a terminal for outputting a high-frequency signal (reception signal) from the low-noise amplifier 51 to an external circuit (for example, the signal processing circuit 301), and is connected to the signal processing circuit 301. The low-noise amplifier 51 amplifies the reception signal input to the input terminal, and outputs the amplified signal from the output terminal.

The third transmission/reception circuit 40 may include an input matching circuit connected between the reception filter 47 and the input terminal of the low-noise amplifier 51. The input matching circuit is a circuit for performing impedance matching between the reception filter 47 and the low-noise amplifier 51.

The high-frequency circuit 2 further includes a controller 55 that controls a plurality of (four in the illustrated example) power amplifiers 24, 37, 48, and 50 in accordance with a control signal from the signal processing circuit 301. The controller 55 is compliant with, for example, the MIPI standard. The high-frequency circuit 2 further includes a signal terminal T10 to which the controller 55 is connected. The controller 55 is connected to the signal processing circuit 301 via, for example, the signal terminal T10. The signal terminal T10 is a terminal for inputting a control signal from an external circuit (for example, the signal processing circuit 301) to the controller 55. The controller 55 controls the plurality of power amplifiers 24, 37, 48, and 50 based on the control signal acquired from the signal terminal T10.

Further, the high-frequency circuit 2 includes a plurality of ground terminals. The plurality of ground terminals means terminals that are electrically connected to the ground electrodes of the above-described circuit board included in the communication device 300 and are supplied with ground potential.

3. Details of High-Frequency Module

Hereinafter, the details of the high-frequency module 1 will be described with reference to FIGS. 1 to 12.

3.1. Circuit Configuration of High-Frequency Module

The high-frequency module 1 includes a plurality of external connection terminals. As illustrated in FIG. 8, the plurality of external connection terminals includes the common terminal 600, the first terminal 601, the second terminal 602, the third terminal 603, and the ground terminal 623 (see FIG. 6D). The common terminal 600 is an external connection terminal to which the first input/output electrode 111 of the first filter 11, the input/output electrode 121 of the second filter 12, and the input/output electrode 131 of the third filter 13 are connected. The first terminal 601 is an external connection terminal to which the second input/output electrode 112 of the first filter 11 is connected. The second terminal 602 is an external connection terminal to which the input/output electrode 122 of the second filter 12 is connected. The third terminal 603 is an external connection terminal to which the input/output electrode 132 of the third filter 13 is connected.

The high-frequency module 1 may include a first matching circuit connected between the second input/output electrode 112 of the first filter 11 and the first terminal 601. The first matching circuit is, for example, a circuit for matching the impedance between the first filter 11 and a circuit to be connected to the side opposite to the first filter 11 side in the first terminal 601.

The high-frequency module 1 also includes a matching circuit 152 connected between the input/output electrode 122 of the second filter 12 and the second terminal 602. The matching circuit 152 is, for example, a circuit for matching the impedance between the second filter 12 and a circuit that is connected to the side opposite to the second filter 12 side in the second terminal 602.

Further, the high-frequency module 1 includes a matching circuit 153 connected between the input/output electrode 132 of the third filter 13 and the third terminal 603. The matching circuit 153 is, for example, a circuit for matching the impedance between the third filter 13 and a circuit that is connected to the side opposite to the third filter 13 side in the third terminal 603.

Figure 9:
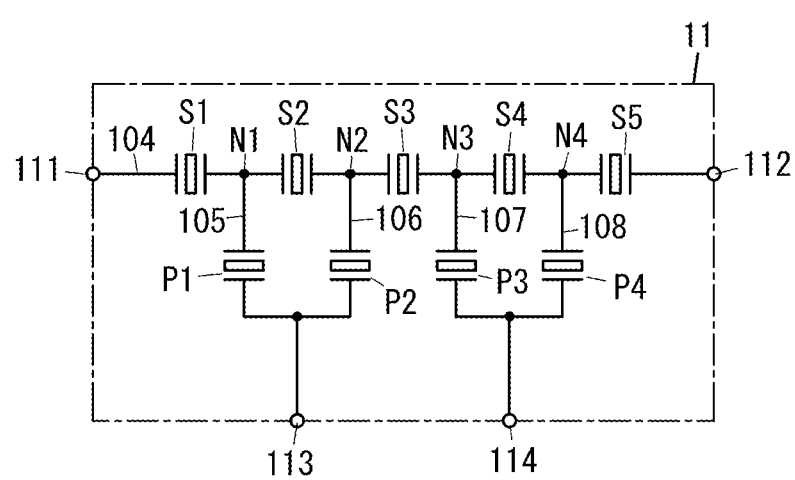
FIG. 9 is a circuit diagram of the first filter in the above high-frequency module.

The first filter 11 is, for example, a ladder filter. The first filter 11 includes a plurality of resonators. The plurality of resonators includes, for example, a plurality of (for example, five) series arm resonators S1 to S5 and a plurality of (for example, four) parallel arm resonators P1 to P4, as illustrated in FIG. 9.

The plurality of series arm resonators S1 to S5 is provided on a path 104 (hereinafter, also referred to as a series arm path 104) between the first input/output electrode 111 and the second input/output electrode 112. The plurality of series arm resonators S1 to S5 is connected in series on the series arm path 104. In the first filter 11, on the series arm path 104, the plurality of series arm resonators S1 to S4 is lined up from the first input/output electrode 111 side to the series arm resonator S1, the series arm resonator S2, the series arm resonator S3, the series arm resonator S4, and the series arm resonator S5 in this order.

The parallel arm resonator P1 is provided on a path 105 (parallel arm path 105) between a node N1 on the series arm path 104 and the ground electrode 113. The node N1 is located between the series arm resonator S1 and the series arm resonator S2 on the series arm path 104. The parallel arm resonator P2 is provided on a path 106 (parallel arm path 106) between a node N2 on the series arm path 104 and the ground electrode 113. The node N2 is located between the series arm resonator S2 and the series arm resonator S3 on the series arm path 104. The parallel arm resonator P3 is provided on a path 107 (parallel arm path 107) between a node N3 on the series arm path 104 and the ground electrode 114. The node N3 is located between the series arm resonator S3 and the series arm resonator S4 on the series arm path 104. The parallel arm resonator P4 is provided in a path 108 (parallel arm path 108) between a node N4 on the series arm path 104 and the ground electrode 114. The node N4 is located between the series arm resonator S4 and the series arm resonator S5 on the series arm path 104.

The first filter 11 is, for example, an acoustic wave filter, and each of the plurality of acoustic wave resonators (the plurality of series arm resonators S1 to S5 and the plurality of parallel arm resonators P1 to P4) is configured by an acoustic wave resonator. The acoustic wave filter is, for example, a surface acoustic wave (SAW) filter that utilizes a surface acoustic wave. In this case, each of the plurality of resonators is a SAW resonator.

Similarly to the first filter 11, each of the second filter 12 and the third filter 13 is an acoustic wave filter. Description of the circuit configurations of the second filter 12 and the third filter 13 will be omitted.

3.2. Structure of High-Frequency Module

As illustrated in FIG. 1, the high-frequency module 1 according to Embodiment 1 includes the mounting substrate 6, the first filter 11, the second filter 12, the third filter 13, and the plurality of (six in the illustrated example) electronic components 16.

In the high-frequency module 1, the first filter 11, the second filter 12, the third filter 13, and the plurality of electronic components 16 are arranged on the first main surface 61 of the mounting substrate 6. The plurality of electronic components 16 includes constituent elements (inductors, capacitors, and the like) of the matching circuits 140, 142, 152, and 153.

As illustrated in FIGS. 3 and 4, the mounting substrate 6 has the first main surface 61 and the second main surface 62 facing each other in the thickness direction D1 of the mounting substrate 6. The mounting substrate 6 is a multi-layer substrate including a plurality of (for example, 20 layers) dielectric layers and a plurality of (for example, 20 layers) conductive layers, for example. The plurality of dielectric layers and the plurality of conductive layers are laminated in the thickness direction D1 of the mounting substrate 6. The plurality of conductive layers is formed in a predetermined pattern defined on a layer-by-layer basis. Each of the plurality of conductive layers includes one or a plurality of conductor portions in a plane orthogonal to the thickness direction D1 of the mounting substrate 6. The material of each conductive layer is, for example, copper. The plurality of conductive layers includes the first land electrode 611, the second land electrode 612, a third land electrode 613, a fourth land electrode 614, the ground terminal 623, and a ground layer 651 (see FIGS. 3 and 4). As illustrated in FIG. 6D, the mounting substrate 6 has a plurality of (nine) ground terminals 623. In the high-frequency module 1, the plurality of ground terminals 623 and the ground layer 651 are connected by a plurality of (for example, 15) ground via conductors 652 (see FIGS. 3, 4 and 6D) included in the mounting substrate 6. The mounting substrate 6 is, for example, a low temperature co-fired ceramics (LTCC) substrate. The mounting substrate 6 is not limited to the LTCC substrate, and may be, for example, a printed wiring board, an HTCC (High Temperature Co-fired Ceramics) substrate, or a resin multilayer substrate.

Further, the mounting substrate 6 is not limited to the LTCC substrate, and may be, for example, a wiring structure. The wiring structure is, for example, a multilayer structure. The multilayer structure includes at least one insulating layer and at least one conductive layer. The insulating layer is formed in a predetermined pattern. In a case where a plurality of insulating layers is provided, the plurality of insulating layers is formed in a predetermined pattern defined on a layer-by-layer basis. The conductive layer is formed in a predetermined pattern that is different from a predetermined pattern of the insulating layer. In a case where the plurality of conductive layers is provided, the plurality of conductive layers is formed in a predetermined pattern defined on a layer-by-layer basis. The conductive layer may include one or more rewiring portions. In the wiring structure, a first surface of two surfaces facing each other in a thickness direction of the multilayer structure corresponds to the first main surface 61 of the mounting substrate 6, and a second surface corresponds to the second main surface 62 of the mounting substrate 6. The wiring structure may be, for example, an interposer. The interposer may be an interposer using a silicon substrate, or may be a substrate configured by multiple layers.

The first main surface 61 and the second main surface 62 of the mounting substrate 6 are separated in the thickness direction D1 of the mounting substrate 6, and intersect with the thickness direction D1 of the mounting substrate 6. The first main surface 61 of the mounting substrate 6 is, for example, orthogonal to the thickness direction D1 of the mounting substrate 6, but may include, for example, a side surface or the like of the conductor portion as a surface that is not orthogonal to the thickness direction D1. Further, the second main surface 62 of the mounting substrate 6 is, for example, orthogonal to the thickness direction D1 of the mounting substrate 6, but may include, for example, a side surface or the like of the conductor portion as a surface that is not orthogonal to the thickness direction D1. Further, the first main surface 61 and the second main surface 62 of the mounting substrate 6 may be formed with fine irregularities or concave portions or convex portions. In the plan view from the thickness direction D1 of the mounting substrate 6, the mounting substrate 6 has a substantially square shape, but is not limited thereto, and may have a substantially rectangular shape or a substantially polygonal shape other than a substantially quadrangular shape, for example.

The first filter 11, the second filter 12, the third filter 13, and the plurality of electronic components 16 are mounted on the mounting substrate 6. Here, "mounted on the mounting substrate 6" includes being arranged on the mounting substrate 6 (mechanically connected) and being electrically connected to (an appropriate conductor portion of) the mounting substrate 6. The high-frequency module 1 may include a circuit element provided in the mounting substrate 6.

The first filter 11 includes two ground electrodes 113 and 114, in addition to the first input/output electrode 111 and the second input/output electrode 112 described above. In addition, the plurality of electronic components 16 is a surface-mounted inductor or a surface-mounted capacitor, and has two electrodes. On the other hand, as illustrated in FIGS. 2 and 3, the mounting substrate 6 further includes the third land electrode 613 connected to the ground electrode 113 and the fourth land electrode 614 connected to the ground electrode 114. Further, the mounting substrate 6 has two fifth land electrodes 616 and 616 to which two electrodes of the electronic component 16 are connected for each of the plurality of (six) electronic components 16. That is, the mounting substrate 6 has twelve fifth land electrodes 616.

Each of the first land electrode 611, the second land electrode 612, the third land electrode 613, and the fourth land electrode 614 has a substantially circular shape in a plan view from the thickness direction D1 of the mounting substrate 6. In addition, each of the plurality of (twelve) fifth land electrodes 616 has a substantially quadrangular shape in a plan view from the thickness direction D1 of the mounting substrate 6.

Figure 6A:
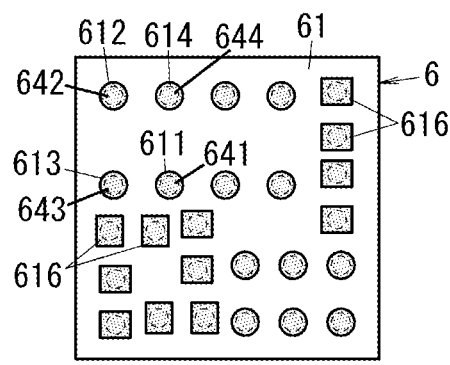
FIG. 6A is a plan view of a mounting substrate in the above high-frequency module.
Figure 6B:
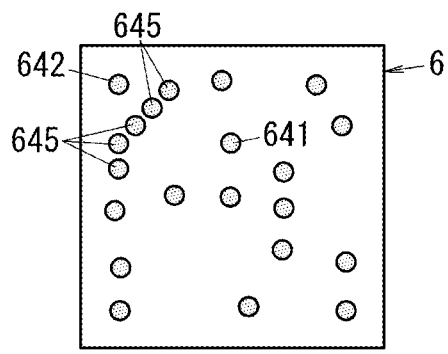
FIG. 6B is a cross-sectional view taken along a line B-B in FIG. 4, illustrating the mounting substrate in the above high-frequency module.
Figure 6C:
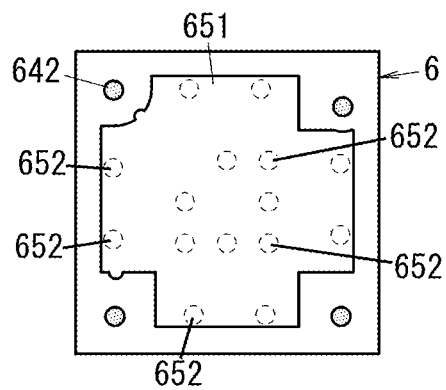
FIG. 6C is a cross-sectional view taken along a line C-C in FIG. 4, illustrating the mounting substrate in the above high-frequency module.
Figure 6D:
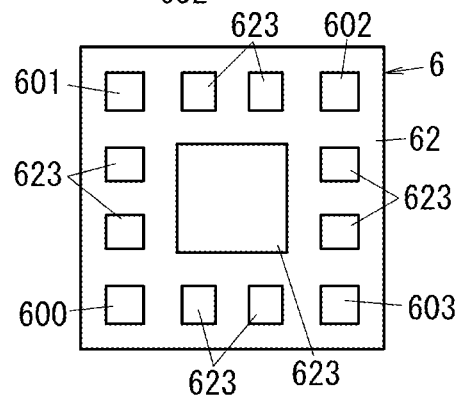
FIG. 6D is a plan view illustrating the mounting substrate in the above high-frequency module, and viewing a second main surface from a first main surface side of the mounting substrate in a see-through manner.

In the mounting substrate 6, as illustrated in FIG. 6A, the second land electrode 612 is arranged at one corner portion of the first main surface 61 of the mounting substrate 6 in a plan view from the thickness direction D1 of the mounting substrate 6. Further, in the mounting substrate 6, the third land electrode 613, the second land electrode 612, and the fourth land electrode 614 are lined up in a direction along an outer periphery of the mounting substrate 6 in a plan view of the mounting substrate 6. In the mounting substrate 6, as illustrated in FIG. 2, in a plan view from the thickness direction D1 of the mounting substrate 6, the first land electrode 611, the fourth land electrode 614, the second land electrode 612, and the third land electrode 613 are located one by one at four vertices of a right quadrilateral SQ1 having, as one diagonal line, a straight line DA1 connecting the center of the first land electrode 611 and the center of the second land electrode 612. The center of each of the third land electrode 613 and the fourth land electrode 614 coincides with the vertex of the right quadrilateral SQ1, but is not limited thereto, and may be displaced therefrom.

As illustrated in FIG. 5, the first filter 11 includes a piezoelectric substrate 110, a plurality of (for example, nine) interdigital transducer (IDT) electrodes 116, the first input/output electrode 111, the second input/output electrode 112, and the two ground electrodes 113 and 114. The piezoelectric substrate 110 has a first main surface 1101 and a second main surface 1102 that face each other. The IDT electrode 116 is provided on the first main surface 1101 of the piezoelectric substrate 110. The piezoelectric substrate 110 is a piezoelectric substrate. The material of the piezoelectric substrate is, for example, lithium tantalate or lithium niobate.

Further, the first filter 11 has a spacer layer 118, a cover member 119, the first input/output electrode 111, the second input/output electrode 112, and the two ground electrodes 113 and 114 as constituent elements of the package structure.

The spacer layer 118 and the cover member 119 are provided on the first main surface 1101 side of the piezoelectric substrate 110. The spacer layer 118 surrounds the plurality of IDT electrodes 116 in a plan view from the thickness direction D1 of the mounting substrate 6. In a plan view from the thickness direction D1 of the mounting substrate 6, the spacer layer 118 has a substantially rectangular frame shape. The spacer layer 118 has an electrical insulation property. The material of the spacer layer 118 is epoxy resin, a polyimide, or the like. The cover member 119 has a substantially flat plate shape. The cover member 119 is arranged on the spacer layer 118 so as to face the piezoelectric substrate 110 in the thickness direction D1 of the mounting substrate 6. The cover member 119 overlaps the plurality of IDT electrodes 116 in the thickness direction D1 of the mounting substrate 6, and is spaced apart from the plurality of IDT electrodes 116 in the thickness direction D1 of the mounting substrate 6. The cover member 119 has an electrical insulation property. The material of the cover member 119 is epoxy resin, polyimide, or the like. The first filter 11 has a space 117 surrounded by the piezoelectric substrate 110, the spacer layer 118, and the cover member 119. In the first filter 11, a gas is contained in the space 117. The gas is air, an inert gas (for example, nitrogen gas), or the like.

In the first filter 11, the first input/output electrode 111, the second input/output electrode 112, and the two ground electrodes 113 and 114 are exposed from the cover member 119. Each of the first input/output electrode 111, the second input/output electrode 112, and the two ground electrodes 113 and 114 is, for example, a bump. Each bump is, for example, a solder bump. Each bump is not limited to a solder bump, and may be, for example, a gold bump.

As illustrated in FIGS. 1 and 8, the second filter 12 has the two input/output electrodes 121 and 122. In the high-frequency module 1 according to Embodiment 1, the piezoelectric substrate 110 is shared by the first filter 11 and the second filter 12, and the filter device 10 of one package is arranged on the first main surface 61 of the mounting substrate 6. The fact that the filter device 10 is arranged on the first main surface 61 of the mounting substrate 6 means that the first filter 11 and the second filter 12 are arranged on the first main surface 61 of the mounting substrate 6. Here, the filter device 10 is mounted on the first main surface 61 of the mounting substrate 6.

The filter device 10 has a substantially rectangular shape in a plan view from the thickness direction D1 of the mounting substrate 6. In the filter device 10, in a plan view from the thickness direction D1 of the mounting substrate 6, the half in a longitudinal direction configures the first filter 11, and a remaining portion configures the second filter 12. A ratio of an area occupied by the first filter 11 in the filter device 10 to an area occupied by the second filter 12 in a plan view from the thickness direction D1 of the mounting substrate 6 is about 1:1, but the present disclosure is not limited thereto. In the first filter 11, in a plan view from the thickness direction D1 of the mounting substrate 6, the second input/output electrode 112 and the ground electrode 114 are lined up along one long side of two long sides of the filter device 10, the ground electrode 113 and the first input/output electrode 111 are lined up along the other long side, and the second input/output electrode 112 and the ground electrode 113 are lined up along one short side of two short sides. Further, in the first filter 11, the second input/output electrode 112 is located at one corner portion out of the four corner portions of the filter device 10 in a plan view from the thickness direction D1 of the mounting substrate 6.

As illustrated in FIGS. 1 and 8, the third filter 13 has two input/output electrodes 131 and 132. The third filter 13 is arranged on the first main surface 61 of the mounting substrate 6. Here, the third filter 13 is mounted on the first main surface 61 of the mounting substrate 6. The third filter 13 has a substantially rectangular shape in a plan view from the thickness direction D1 of the mounting substrate 6, and is separated from the first filter 11 and the second filter 12.

The plurality of electronic components 16 is arranged on the first main surface 61 of the mounting substrate 6. Here, the plurality of electronic components 16 is mounted on the first main surface 61 of the mounting substrate 6.

As described above, the mounting substrate 6 includes the first land electrode 611, the second land electrode 612, the ground terminal 623, and the plurality of (for example, five) via conductors 645. The first land electrode 611 is connected to the first input/output electrode 111. The second land electrode 612 is connected to the second input/output electrode 112. The ground terminal 623 is located closer to the second main surface 62 side than the first main surface 61 in the thickness direction D1 of the mounting substrate 6. The plurality of via conductors 645 is arranged between the first main surface 61 and the second main surface 62, and is connected to the ground terminal 623.

Each of the plurality of via conductors 645 has a substantially columnar shape. Each of the plurality of via conductors 645 is arranged along the thickness direction D1 of the mounting substrate 6. Each of the plurality of via conductors 645 has a substantially circular shape in a plan view from the thickness direction D1 of the mounting substrate 6.

As illustrated in FIG. 3, the mounting substrate 6 has a via conductor 643 connected to the third land electrode 613, a via conductor 644 connected to the fourth land electrode 614, and an inner layer wiring portion 646 connecting the two via conductors 643 and 644 and five via conductors 645. Accordingly, the two ground electrodes 113 and 114 of the first filter 11 are electrically connected to the five via conductors 645. The inner layer wiring portion 646 overlaps the via conductor 643, the via conductor 644, and the five via conductors 645 in the thickness direction D1 of the mounting substrate 6. The inner layer wiring portion 646 connects the five via conductors 645 on the first main surface 61 side of the mounting substrate 6.

Further, the mounting substrate 6 has an inner layer wiring portion 647 that connects the five via conductors 645 on the second main surface 62 side of the mounting substrate 6. The inner layer wiring portion 647 overlaps the five via conductors 645 in the thickness direction D1 of the mounting substrate 6.

As illustrated in FIG. 6D, the high-frequency module 1 according to Embodiment 1 has the plurality of (nine) ground terminals 623. A surface of each of the plurality of ground terminals 623 configures a part of the second main surface 62.

The mounting substrate 6 further includes the ground layer 651 connected to the plurality of (five) via conductors 645 and the plurality of (nine) ground terminals 623. The ground layer 651 is located between the five via conductors 645 and the nine ground terminals 623 in the thickness direction D1 of the mounting substrate 6.

The ground layer 651 overlaps the five via conductors 645 and the nine ground terminals 623 in a plan view from the thickness direction D1. In the mounting substrate 6, in the thickness direction of the mounting substrate 6, a distance between the ground layer 651 and the second main surface 62 is shorter than a distance between the ground layer 651 and the first main surface 61. In the thickness direction D1 of the mounting substrate 6, the length of each of the five via conductors 645 is shorter than a distance between the first main surface 61 and the second main surface 62, and is longer than the distance between the ground layer 651 and the second main surface 62. The length of each of the five via conductors 645 is longer than the lengths of the via conductor 643 and the via conductor 644. In the high-frequency module 1 according to Embodiment 1, the lengths of the five via conductors 645 are the same as one another, but may be different from one another. The five via conductors 645 and the ground layer 651 are electrically connected to each other through a via conductor 648 connected to the inner layer wiring portion 647, an inner layer wiring portion 649 connected to the via conductor 648, and a via conductor 650 connected to the inner layer wiring portion 649.

In the high-frequency module 1, an area of the ground layer 651 is larger than an area of the filter 11 in a plan view from the thickness direction D1 of the mounting substrate 6. The ground layer 651 does not overlap the common terminal 600, the first terminal 601, the second terminal 602, and the third terminal 603 in a plan view from the thickness direction D1 of the mounting substrate 6.

The high-frequency module 1 further includes the above-described ground via conductor 652 (via conductor 652), different from the plurality of via conductors 645, that is located between the ground layer 651 and the ground terminal 623 in the thickness direction D1 of the mounting substrate 6 and connect the ground layer 651 and the ground terminal 623. In the high-frequency module 1, the size of the ground terminal 623 located in the middle in a plan view of the mounting substrate 6 in the thickness direction D1 among the nine ground terminals 623 is larger than the sizes of the other eight ground terminals 623 (see FIG. 6D). The ground terminal 623 and the ground layer 651 located in the middle are connected by the plurality of (for example, 7) via conductors 652 (see FIG. 6C), and the other eight ground terminals 623 and the ground layer 651 are connected by one via conductor 652.

As illustrated in FIG. 2, the plurality of via conductors 645 is located between the first land electrode 611 and the second land electrode 612 in a plan view from the thickness direction D1 of the mounting substrate 6. The fact that "located between the first land electrode 611 and the second land electrode 612" means that in a plan view from the thickness direction D1 of the mounting substrate 6, the center of each of the plurality of via conductors 645 is located inside the right quadrilateral SQ1 having, as one diagonal line, the straight line DA1 connecting the center of the first land electrode 611 and the center of the second land electrode 612. Here, with respect to the via conductors 645 not on the straight line DA1 among the plurality of via conductors 645, in a virtual triangle with the center of the first land electrode 611, the center of the via conductor 645, and the center of the second land electrode 612 as a vertex, a vertex angle α at the vertex corresponding to the center of the via conductor 645 is larger than about 90 degrees and smaller than about 180 degrees.

The distance between two adjacent via conductors 645 among the plurality of via conductors 645 is equal to or less than one fourth a wavelength of a radio wave at a center frequency of the predetermined pass band. The predetermined pass band is, for example, included in the frequency band of 2400 MHz to 2483 MHz. The center frequency of the predetermined pass band is, for example, 2441.5 MHz.

As illustrated in FIGS. 3, 5, and 6A, the mounting substrate 6 further includes a first wiring portion 641 connected to the first land electrode 611 and a second wiring portion 642 connected to the second land electrode 612. The plurality of via conductors 645 is located between the first wiring portion 641 and the second wiring portion 642 in a plan view from the thickness direction D1 of the mounting substrate 6. The first wiring portion 641 includes a plurality of wiring via conductors and a plurality of inner layer wiring portions. The second wiring portion 642 includes a wiring via conductor that connects the second land electrode 612 and the first terminal 601.

The high-frequency module 1 further includes a resin layer 7. The resin layer 7 covers a plurality of circuit elements arranged on the first main surface 61 of the mounting substrate 6 on the first main surface 61 side of the mounting substrate 6. Here, the resin layer 7 seals the plurality of circuit elements arranged on the first main surface 61 of the mounting substrate 6. The plurality of circuit elements arranged on the first main surface 61 of the mounting substrate 6 includes the first filter 11, the second filter 12, the third filter 13, and the plurality of electronic components 16. The resin layer 7 contains resin. The resin layer 7 may contain a filler in addition to the resin.

Further, the high-frequency module 1 may further include a shield layer. The material of the shield layer is, for example, a metal. The shield layer covers, for example, a main surface and an outer peripheral surface of the resin layer 7 and an outer peripheral surface of the mounting substrate 6.

3.3. Characteristic of High-Frequency Module

Figure 10:
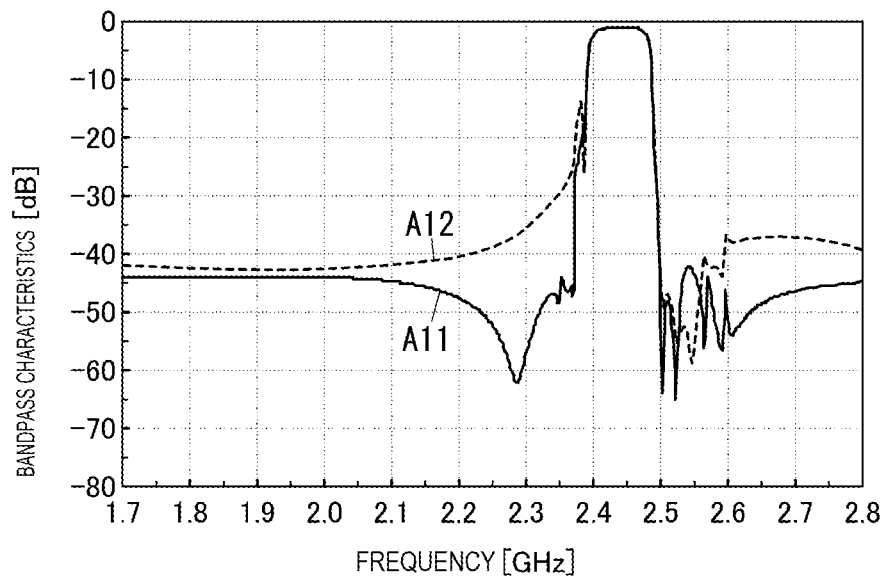
FIG. 10 is a graph illustrating filter bandpass characteristics of a first filter in the high-frequency module according to Embodiment 1 and filter bandpass characteristics of the first filter in a high-frequency module according to a comparative example.

FIG. 10 is a graph illustrating filter bandpass characteristics A11 of the first filter 11 in the high-frequency module 1 according to Embodiment 1 and filter bandpass characteristics A12 of a first filter in a high-frequency module according to a comparative example. The high-frequency module according to the comparative example is different from the high-frequency module 1 according to Embodiment 1 in that the plurality of via conductors 645 of the high-frequency module 1 according to Embodiment 1 is not included.

From FIG. 10, it can be seen that, the high-frequency module 1 according to Embodiment 1 can obtain the filter bandpass characteristics having high attenuation on the low frequency side and the high frequency side of the predetermined pass band of the first filter 11 as compared with the high-frequency module according to the comparative example.

Figure 11:
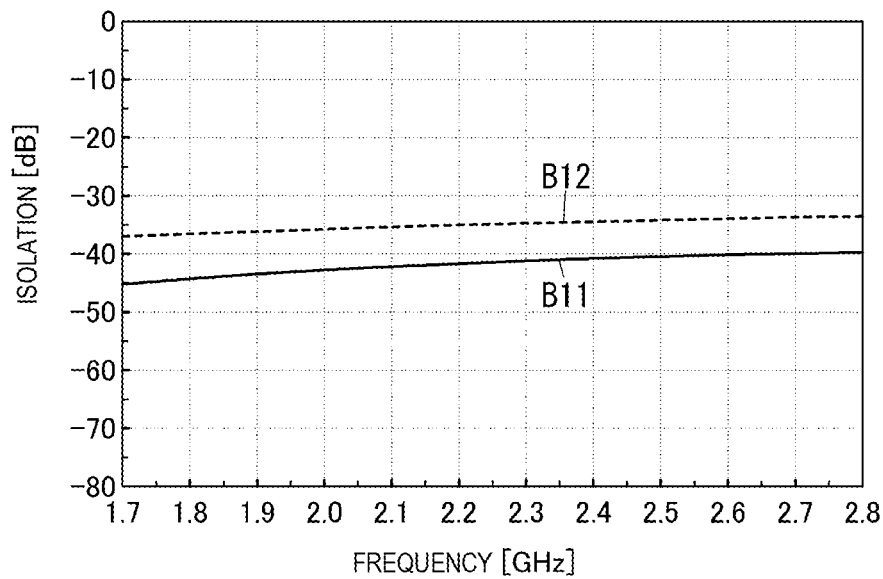
FIG. 11 is a graph illustrating isolation characteristics between a first input/output electrode and a second input/output electrode of the first filter in the high-frequency module according to Embodiment 1 and isolation characteristics between a first input/output electrode and a second input/output electrode of the first filter in the high-frequency module according to the comparative example.

FIG. 11 is a graph illustrating isolation characteristics B11 between the first input/output electrode and the second input/output electrode of the first filter 11 in the high-frequency module 1 according to Embodiment 1 and isolation characteristics B12 between a first input/output electrode and a second input/output electrode of the first filter in the high-frequency module according to the comparative example.

From FIG. 11, it can be seen that in the high-frequency module 1 according to Embodiment 1, the isolation between the first input/output electrode 111 and the second input/output electrode 112 can be improved in at least the frequency band of 1.7 GHz to 2.8 GHz, which includes the predetermined pass band of the first filter 11, as compared with the high-frequency module according to the comparative example.

4. Conclusion 4.1. High-Frequency Module

The high-frequency module 1 according to Embodiment 1 includes the mounting substrate 6 and the filter 11. The mounting substrate 6 has the first main surface 61 and the second main surface 62 that face each other. The filter 11 includes the first input/output electrode 111 and the second input/output electrode 112, and is arranged on the first main surface 61 of the mounting substrate 6. The mounting substrate 6 includes the first land electrode 611, the second land electrode 612, the ground terminal 623, and the plurality of via conductors 645. The first land electrode 611 is connected to the first input/output electrode 111. The second land electrode 612 is connected to the second input/output electrode 112. The ground terminal 623 is located closer to the second main surface 62 side than the first main surface 61 in the thickness direction D1 of the mounting substrate 6. The plurality of via conductors 645 is arranged between the first main surface 61 and the second main surface 62, and is connected to the ground terminal 623. The plurality of via conductors 645 is located between the first land electrode 611 and the second land electrode 612 in a plan view from the thickness direction D1 of the mounting substrate 6.

The high-frequency module 1 according to Embodiment 1 can improve the filter characteristics of the filter 11.

Here, in the high-frequency module 1 according to Embodiment 1, the isolation between the first input/output electrode 111 and the second input/output electrode 112 of the filter 11 is improved, and the filter characteristics of the first filter 11 are improved. In the high-frequency module 1 according to Embodiment 1, by providing the plurality of via conductors 645, it is possible to suppress electromagnetic field coupling between the first input/output electrode 111 and the second input/output electrode 112 of the filter 11 via the mounting substrate 6. Accordingly, the high-frequency module 1 according to Embodiment 1 can improve the isolation and achieve filter characteristics of high attenuation.

Further, in the high-frequency module 1 according to Embodiment 1, the plurality of via conductors 645 is located between the first wiring portion 641 and the second wiring portion 642 in a plan view from the thickness direction D1 of the mounting substrate 6. Thus, in the high-frequency module 1 according to Embodiment 1, the electromagnetic field coupling between the first wiring portion 641 and the second wiring portion 642 can be suppressed, and further improvement of the filter characteristics can be achieved.

4.2. High-Frequency Circuit

The high-frequency circuit 2 according to Embodiment 1 includes the high-frequency module 1 and an amplifier (power amplifier 24 and low-noise amplifier 25) connected to the filter 11 of the high-frequency module 1.

Since the high-frequency circuit 2 according to Embodiment 1 includes the high-frequency module 1, it is possible to improve the filter characteristics of the filter 11.

A module (front-end module) including the high-frequency circuit 2 includes a circuit board on which the high-frequency module 1, a circuit element of the first transmission/reception circuit 20, a circuit element of the second transmission/reception circuit 30, and a circuit element of the third transmission/reception circuit 40 are mounted. The antenna terminal T1 and the signal terminals T2 to T10 are arranged on the circuit board. Further, in the front end module, an external ground terminal to which the ground potential is applied is arranged.

Since the module (front-end module) including the high-frequency circuit 2 includes the high-frequency module 1, it is possible to improve the filter characteristics of the filter 11.

4.3. Communication Device

The communication device 300 according to Embodiment 1 includes the high-frequency circuit 2 and the signal processing circuit 301. The signal processing circuit 301 performs signal processing on a high-frequency signal that passes through the filter 11 of the high-frequency module 1.

Since the communication device 300 according to Embodiment 1 includes the high-frequency module 1, it is possible to improve the filter characteristics of the filter 11.

The plurality of electronic components configuring the signal processing circuit 301 may be mounted on a circuit board (second circuit board) different from the circuit board (first circuit board) on which the high-frequency module 1 is mounted, for example.

5. Modification of High-Frequency Module 5.1. Modification 1

Figure 13:
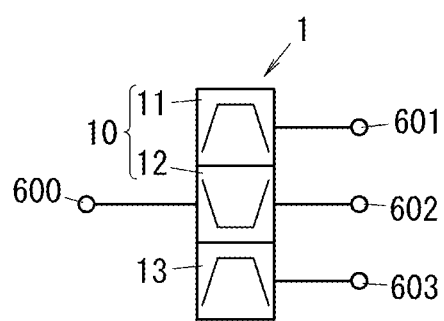
FIG. 13 is a circuit diagram of a high-frequency module according to Modification 1 of Embodiment 1.
Figure 14:
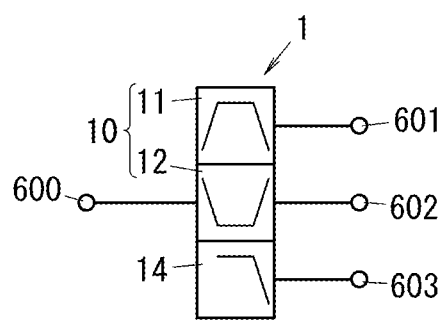
FIG. 14 is a circuit diagram of a high-frequency module according to Modification 2 of Embodiment 1.

The high-frequency module 1 according to Modification 1 of Embodiment 1 will be described with reference to FIG. 13. With respect to the high-frequency module 1 according to Modification 1, the same constituent elements as those of the high-frequency module 1 according to Embodiment 1 are denoted by the same reference numerals, and the description thereof will be omitted.

The high-frequency module 1 according to Modification 1 is different from the high-frequency module 1 according to Embodiment 1 in that a band pass filter corresponding to the L5 band of a satellite positioning system (GNSS) is adopted as the third filter 13. The L5 band is 1164.4 MHz to 1187.95 MHz. The third filter 13 is not limited to the L5 band of the GNSS, and may be a band pass filter corresponding to the L1 band. The L1 band is 1559 MHz to 1606 MHz. Further, the third filter 13 may correspond to a frequency band of a 5 GHz band of Wi-Fi®. The frequency band of the 5 GHz band of Wi-Fi® is 5150 MHz to 7125 MHz.

Further, the high-frequency module 1 according to Modification 1 is different from the high-frequency module according to Embodiment 1 also in that the plurality of (four) matching circuits 140, 142, 152, and 153 are not provided.

5.2. Modification 2

The high-frequency module 1 according to Modification 2 of Embodiment 1 will be described with reference to FIG.

14. With respect to the high-frequency module 1 according to Modification 2, the same constituent elements as those of the high-frequency module 1 according to Embodiment 1 are denoted by the same reference numerals, and the description thereof will be omitted.

The high-frequency module 1 according to Modification 2 is different from the high-frequency module 1 according to Embodiment 1 in that a third filter 14 is provided instead of the third filter 13. The third filter 14 is, for example, a low-pass filter having a pass band on a lower frequency side than the first filter 11. The pass band of the third filter 14 is, for example, 617 MHz to 960 MHz.

Further, the high-frequency module 1 according to Modification 2 is different from the high-frequency module 1 according to Embodiment 1 also in that the plurality of (four) matching circuits 140, 142, 152, and 153 is not provided.

Embodiment 2

A high-frequency module 1*a* according to Embodiment 2 will be described with reference to FIGS. 15 to 18D. The high-frequency module 1*a* according to Embodiment 2 is different from the high-frequency module 1 according to Embodiment 1 in that a mounting substrate 6*a* is included instead of the mounting substrate 6 in the high-frequency module 1 according to Embodiment 1. With respect to the high-frequency module 1*a* according to Embodiment 2, the same constituent elements as those of the high-frequency module 1 according to Embodiment 1 are denoted by the same reference numerals, and the description thereof will be omitted.

Further, the high-frequency module 1*a* according to Embodiment 2 is different from the high-frequency module 1 according to Embodiment 1 in that the number of electronic components 16 is seven. The high-frequency module 1*a* according to Embodiment 2 does not include the third filter 13 in the high-frequency module 1 according to Embodiment 1, but an LC filter corresponding to this is formed by the electronic component 16 and the mounting substrate 6*a*.

Figure 15:
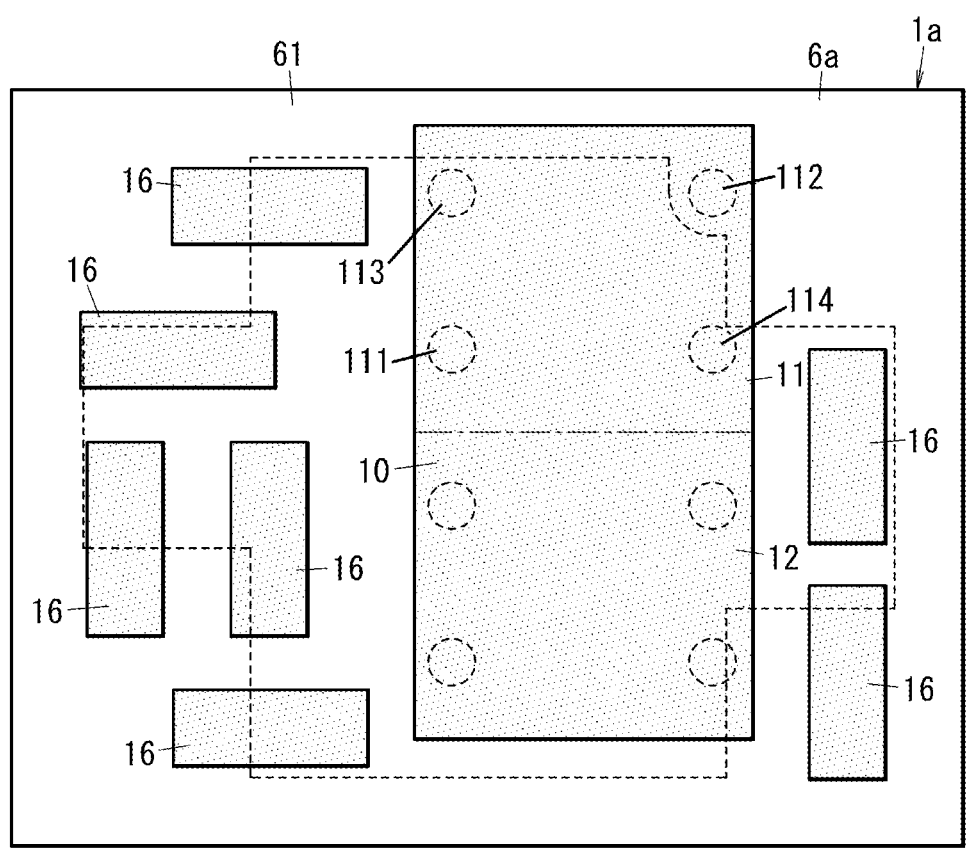
FIG. 15 is a plan view of a high-frequency module according to Embodiment 2.
Figure 16:
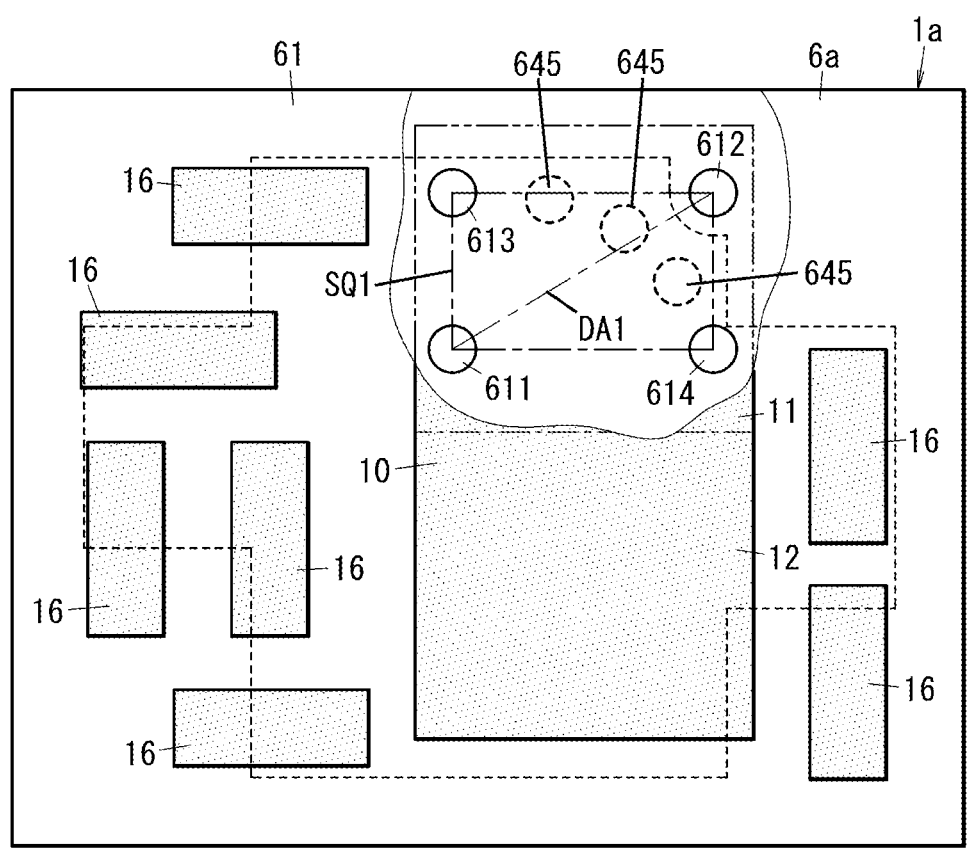
FIG. 16 is a plan view, partially broken out, of the above high-frequency module.
Figure 17:
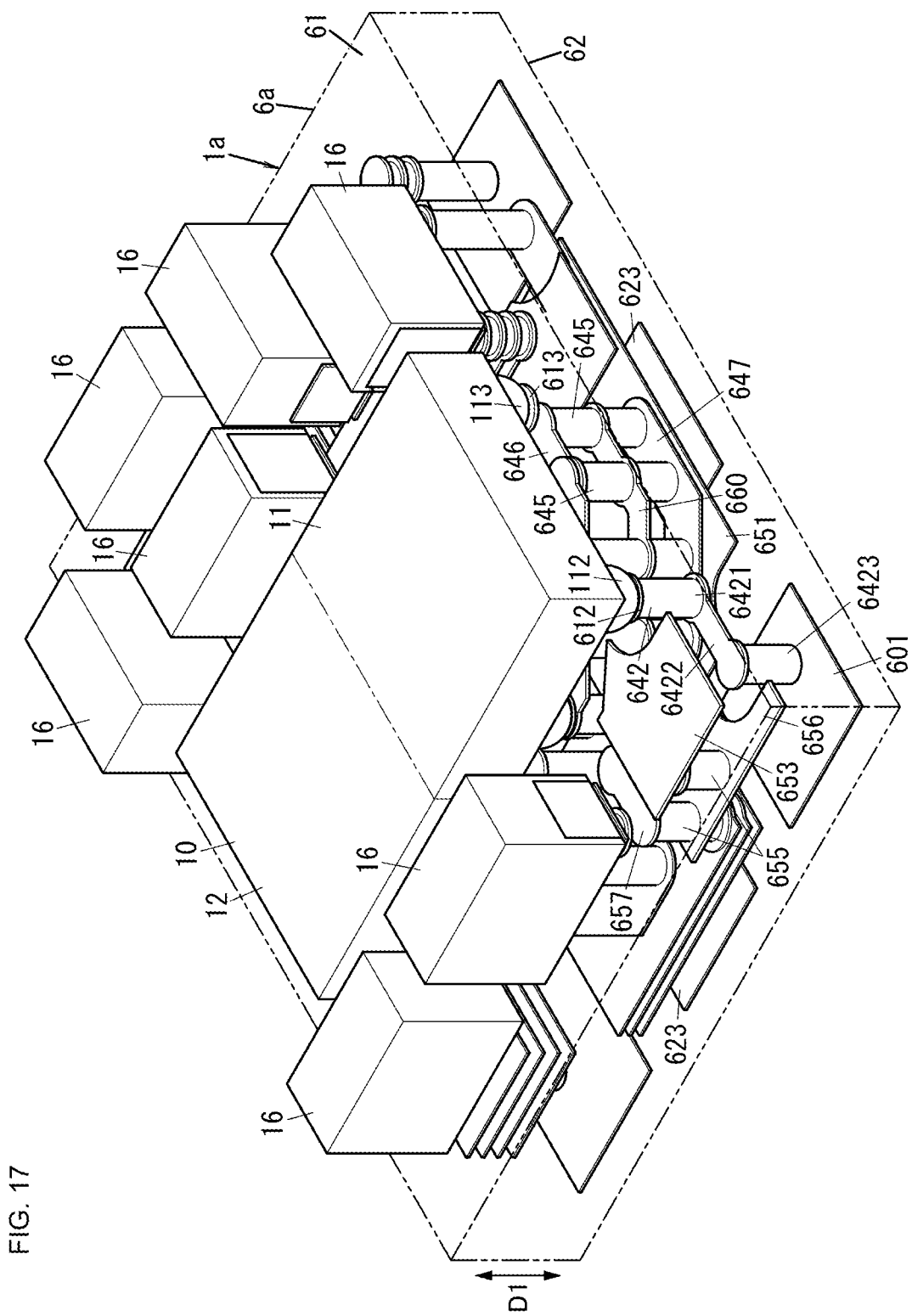
FIG. 17 is a perspective view illustrating the above high-frequency module partially in a see-through manner.
Figure 18:
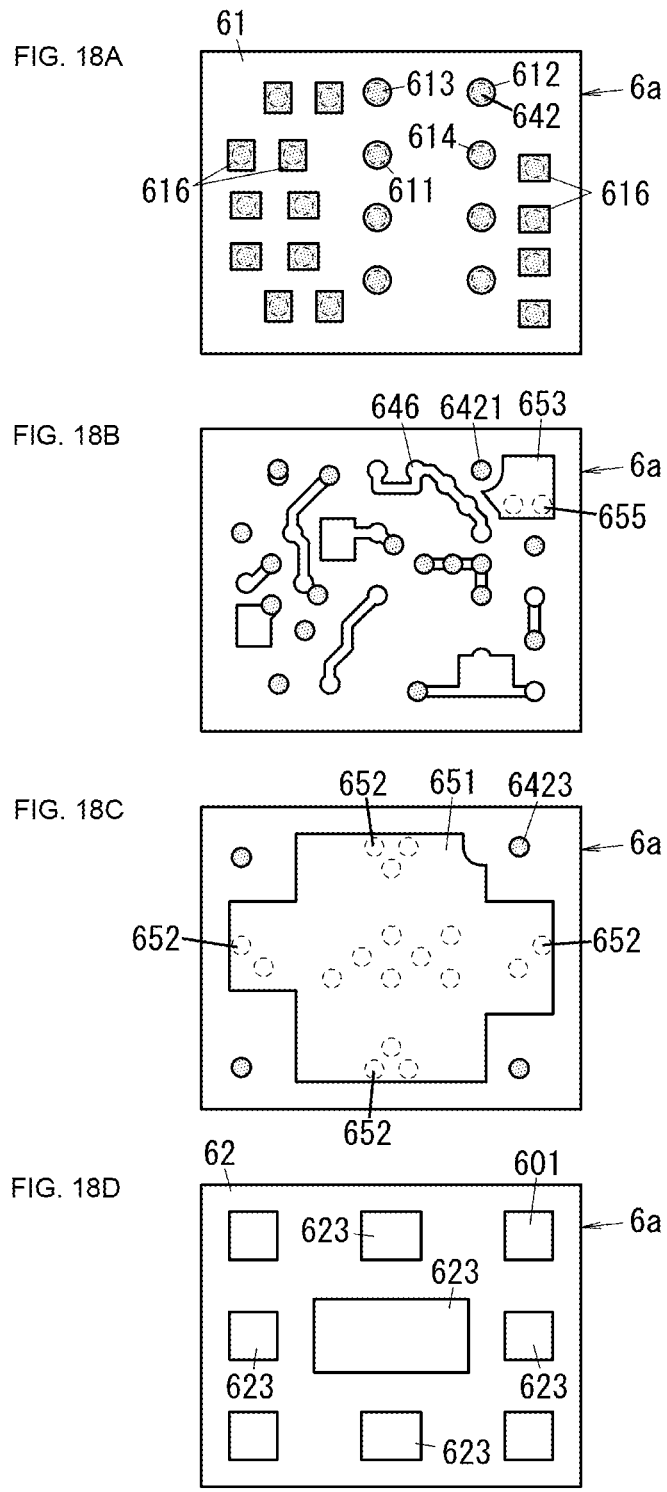
FIG. 18A is a plan view of a mounting substrate in the above high-frequency module.
FIG. 18B is a cross-sectional view of the mounting substrate in the above high-frequency module.
FIG. 18C is another cross-sectional view of the mounting substrate in the above high-frequency module.
FIG. 18D is a plan view illustrating the mounting substrate in the above high-frequency module, and viewing a second main surface from a first main surface side of the mounting substrate in a see-through manner.

As illustrated in FIGS. 15 and 16, the layout of the first filter 11, the second filter 12, and the plurality of electronic components 16 arranged on the mounting substrate 6*a* is different from that of the high-frequency module 1 according to Embodiment 1. With respect to the mounting substrate 6*a*, the same constituent elements as those of the mounting substrate 6 are denoted by the same reference numerals, and the description thereof will be omitted.

In the high-frequency module 1*a*, the mounting substrate 6*a* has a substantially rectangular shape in a plan view from the thickness direction D1 of the mounting substrate 6*a*. In the high-frequency module 1*a*, in a plan view from the thickness direction D1 of the mounting substrate 6*a*, the first filter 11 is arranged so as to be separated from four corner portions of the first main surface 61 of the mounting substrate 6*a*. In the following description, for convenience of description, in a plan view from the thickness direction D1 of the mounting substrate 6*a*, an upper right corner portion of FIG. 15 is referred to as a first corner portion, an upper left corner portion is referred to as a second corner portion, a lower left corner portion is referred to as a third corner portion, and a lower right corner portion is referred to as a fourth corner portion with respect to the four corner portions of the first main surface 61 of the mounting substrate 6*a*.

In the high-frequency module 1*a*, in the first filter 11, the second input/output electrode 112 and the ground electrode 113 are side-by-side in the vicinity of one long side of two long sides of the mounting substrate 6*a* (the long side between the first corner portion and the second corner portion) in a direction along the long side. In addition, in the high-frequency module 1*a*, the second input/output electrode 112 and the ground electrode 114 are side-by-side in the vicinity of one short side of two short sides of the mounting substrate 6*a* (the short side between the first corner portion and the fourth corner portion) in a direction along the short side.

In the mounting substrate 6*a*, the first terminal 601 is arranged at the corner portion among the four corners of the second main surface 62 of the mounting substrate 6*a* that overlaps the first corner portion of the first main surface 61 in the thickness direction D1 of the mounting substrate 6*a*. Accordingly, in the thickness direction D1 of the mounting substrate 6*a*, the second input/output electrode 112 of the first filter 11 does not overlap the first terminal 601.

In the high-frequency module 1*a* according to Embodiment 2, as illustrated in FIGS. 17 and 18A to 18C, the second wiring portion 642 includes two wiring via conductors 6421 and 6423 arranged along the thickness direction D1 of the mounting substrate 6*a* and an inner-layer conductor portion 6422 arranged along a plane orthogonal to the thickness direction D1 of the mounting substrate 6*a*. In the high-frequency module 1*a*, the second land electrode 612 is connected to the wiring via conductor 6421, the wiring via conductor 6421 is connected to the inner-layer conductor portion 6422, the inner-layer conductor portion 6422 is connected to the wiring via conductor 6423, and the wiring via conductor 6423 is connected to the first terminal 601 (see FIGS. 17 and 18D). In the high-frequency module 1 according to Embodiment 1, the second wiring portion 642 has a substantially linear shape, whereas in the high-frequency module 1*a* according to Embodiment 2, the second wiring portion 642 has a substantially crank-like shape.

The mounting substrate 6*a* further includes a second ground layer 653 that is different from the ground layer 651 (hereinafter, also referred to as the first ground layer 651). The second ground layer 653 is arranged between the first main surface 61 of the mounting substrate 6*a* and the inner-layer conductor portion 6422. The second ground layer 653 overlaps the inner-layer conductor portion 6422 in a plan view from the thickness direction D1 of the mounting substrate 6*a*. The second ground layer 653 also overlaps the first terminal 601 in a plan view from the thickness direction D1 of the mounting substrate 6*a*.

In the high-frequency module 1*a* according to Embodiment 2, similarly to the high-frequency module 1 according to Embodiment 1, the plurality of via conductors 645 is located between the first land electrode 611 and the second land electrode 612 in a plan view from the thickness direction D1 of the mounting substrate 6*a*. Accordingly, the high-frequency module 1*a* according to Embodiment 2 can improve the filter characteristics of the filter 11.

Further, since the high-frequency module 1*a* according to Embodiment 2 includes the second ground layer 653, isolation between the second wiring portion 642 and the first wiring portion 641 is improved, and isolation between the first input/output electrode 111 and the second input/output electrode 112 of the filter 11 can be improved.

Figure 12:
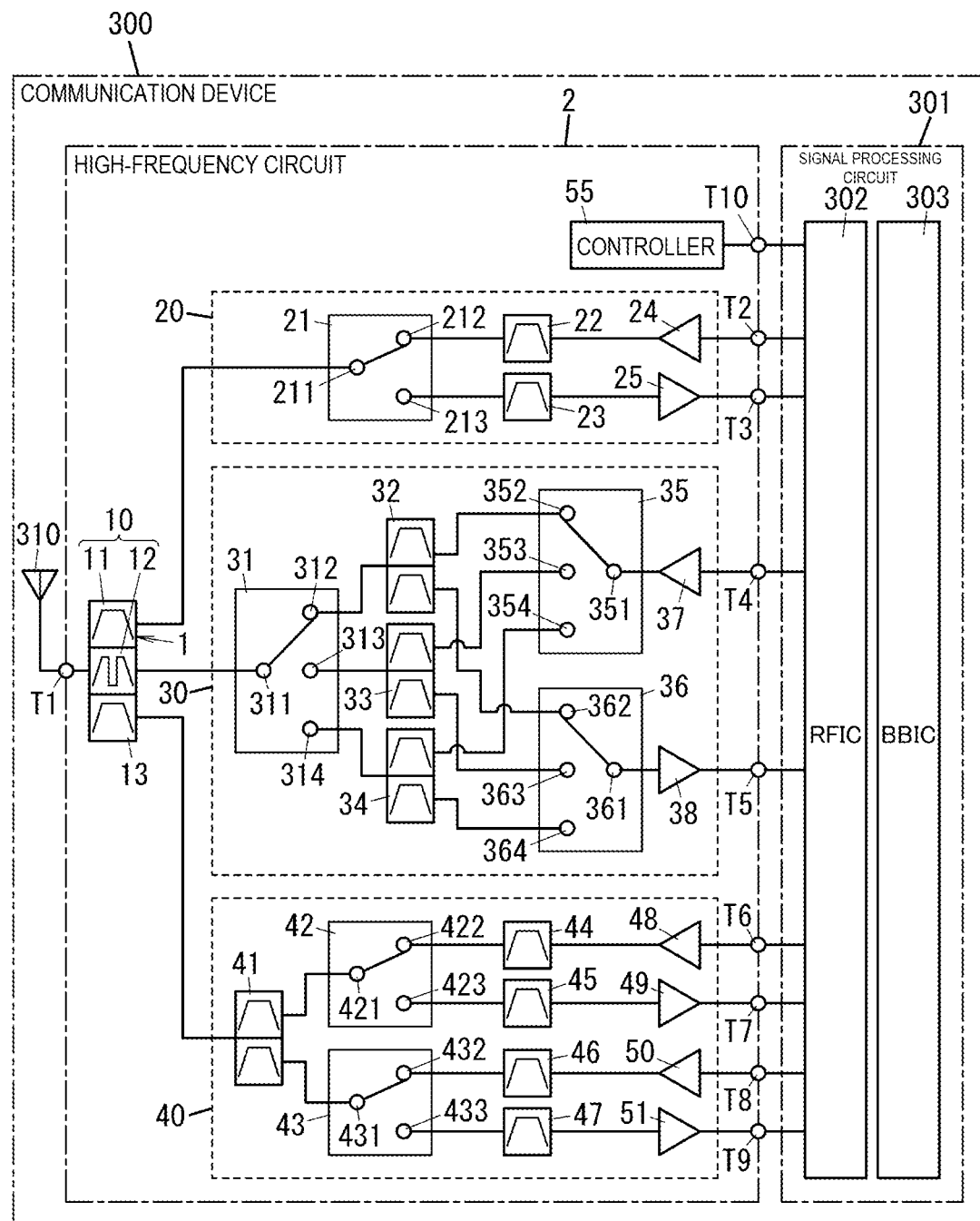
FIG. 12 is a circuit diagram of a high-frequency circuit and a communication device including the high-frequency module according to Embodiment 1.

The high-frequency module 1*a* according to Embodiment 2 can be used, for example, instead of the high-frequency module 1 included in the high-frequency circuit 2 and the communication device 300 according to Embodiment 1 illustrated in FIG. 12.

Figure 19:
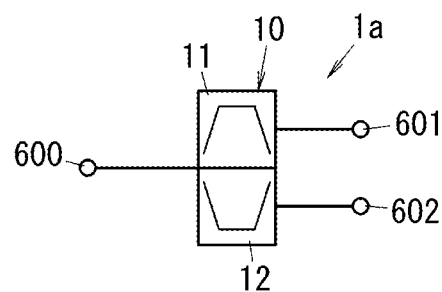
FIG. 19 is a circuit diagram of a high-frequency module according to a modification of Embodiment 2.

The high-frequency module 1a according to a modification of Embodiment 2 will be described with reference to FIG. 19. The high-frequency module 1a according to the modification is different from the high-frequency module 1a according to Embodiment 2 in that a plurality of electronic components is not provided. Further, in the high-frequency module 1a according to Embodiment 2, the multiplexer is a triplexer, whereas in the high-frequency module 1a according to the modification of Embodiment 2, the multiplexer is a diplexer including the first filter 11 and the second filter 12. The high-frequency module 1a according to the modification of Embodiment 2 can be used instead of the high-frequency module 1 included in the high-frequency circuit 2 and the communication device 300 according to Embodiment 1 illustrated in FIG. 12, for example. In this case, the high-frequency circuit 2 and the communication device 300 do not include the third transmission/reception circuit 40.

Embodiment 3

Figure 20:
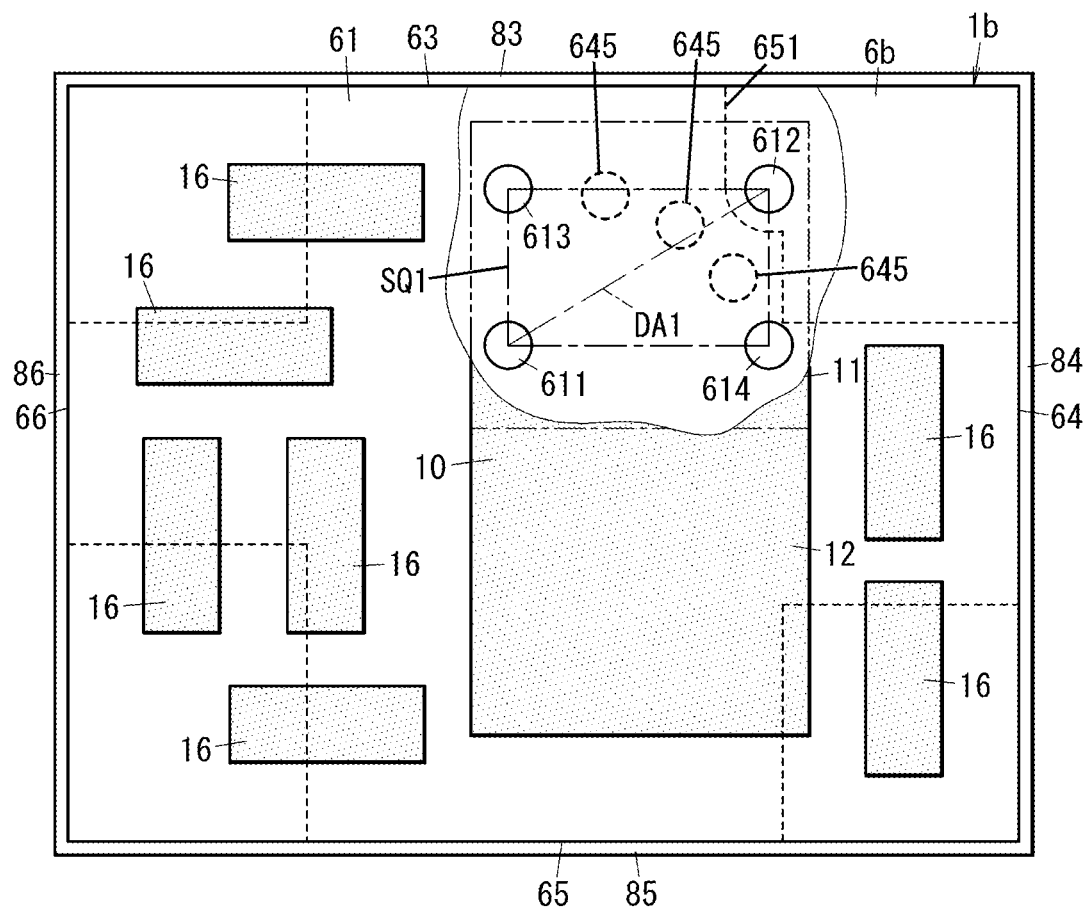
FIG. 20 is a plan view, partially broken out, of a high-frequency module according to Embodiment 3.
Figure 21:
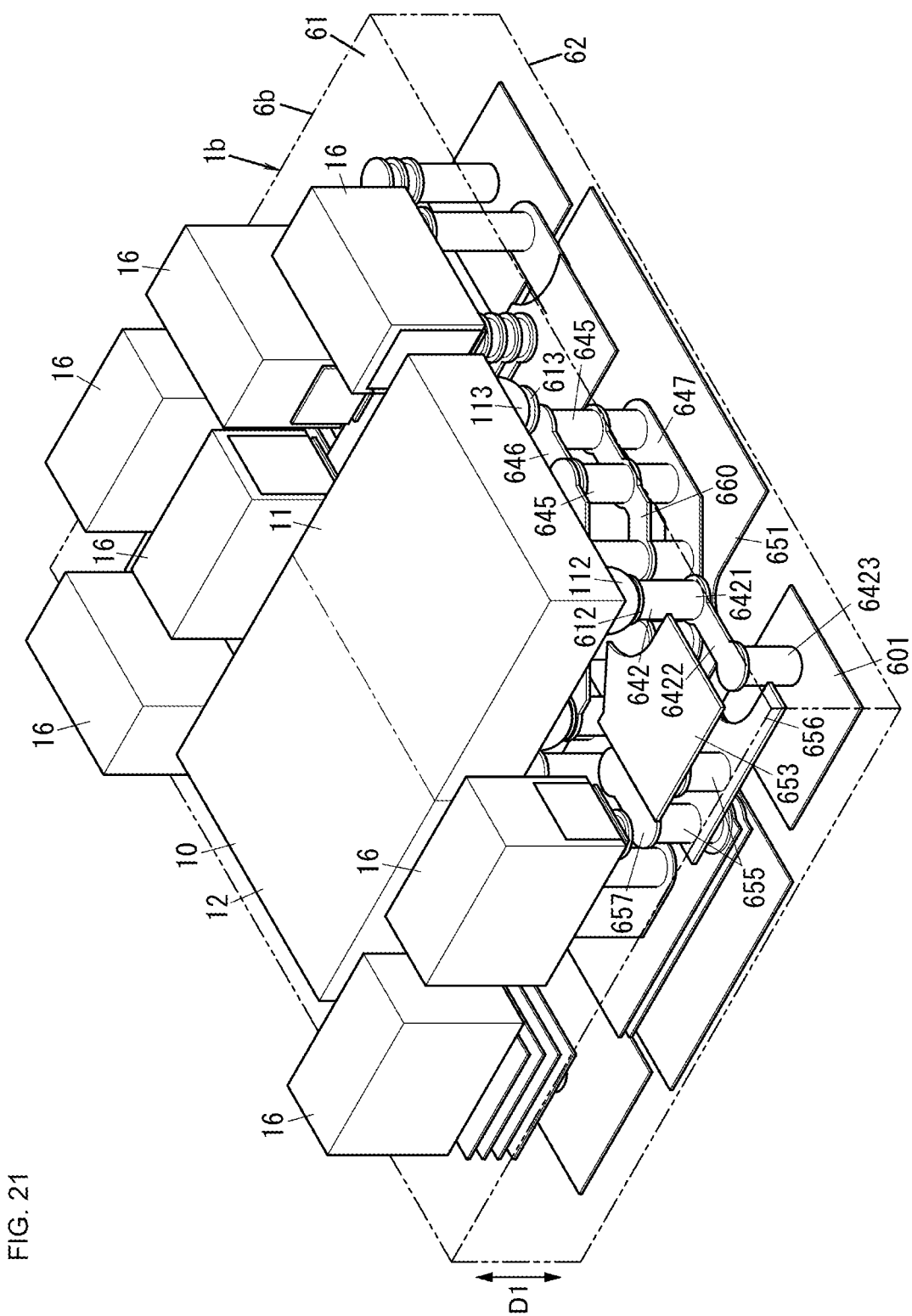
FIG. 21 is a perspective view illustrating the above high-frequency module partially in a see-through manner.

A high-frequency module 1b according to Embodiment 3 will be described with reference to FIGS. 20 and 21. The high-frequency module 1b according to Embodiment 3 is different from the high-frequency module 1a according to Embodiment 2 in that a mounting substrate 6b is provided instead of the mounting substrate 6a in the high-frequency module 1a according to Embodiment 2. With respect to the high-frequency module 1b according to Embodiment 3, the same constituent elements as those of the high-frequency module 1a according to Embodiment 2 are denoted by the same reference numerals, and the description thereof will be omitted.

The mounting substrate 6b has four side surfaces 63, 64, 65, and 66 connecting the first main surface 61 and the second main surface 62. In the mounting substrate 6b, the size of the ground layer 651 is large as compared with the mounting substrate 6a, and an outer peripheral edge of the ground layer 651 reaches the four side surfaces 63, 64, 65, and 66. The high-frequency module 1b further includes two side ground layers 83 and 84 that are respectively arranged on the two side surfaces 63 and 64 close to the second wiring portion 642 out of the four side surfaces 63, 64, 65, and 66 and are connected to the ground layer 651.

Further, the high-frequency module 1b further includes two side ground layers 85 and 86 that are respectively arranged on the side surfaces 65 and 66 and are connected to the ground layer 651.

In the high-frequency module 1b according to Embodiment 3, similarly to the high-frequency module 1 according to Embodiment 1, the plurality of via conductors 645 is located between the first land electrode 611 and the second land electrode 612 in a plan view from the thickness direction D1 of the mounting substrate 6b. Accordingly, the high-frequency module 1b according to Embodiment 3 can improve the filter characteristics of the filter 11.

Further, since the high-frequency module 1b according to Embodiment 3 further includes two side ground layers 83 and 84 that are respectively arranged on the two side surfaces 63 and 64 close to the second wiring portion 642 and are connected to the ground layer 651, it is possible to improve isolation between the first input/output electrode 111 and the second input/output electrode 112.

The high-frequency module 1b according to Embodiment 3 can be used, for example, instead of the high-frequency module 1 included in the high-frequency circuit 2 and the communication device 300 according to Embodiment 1 illustrated in FIG. 12.

Embodiment 4

Figure 22:
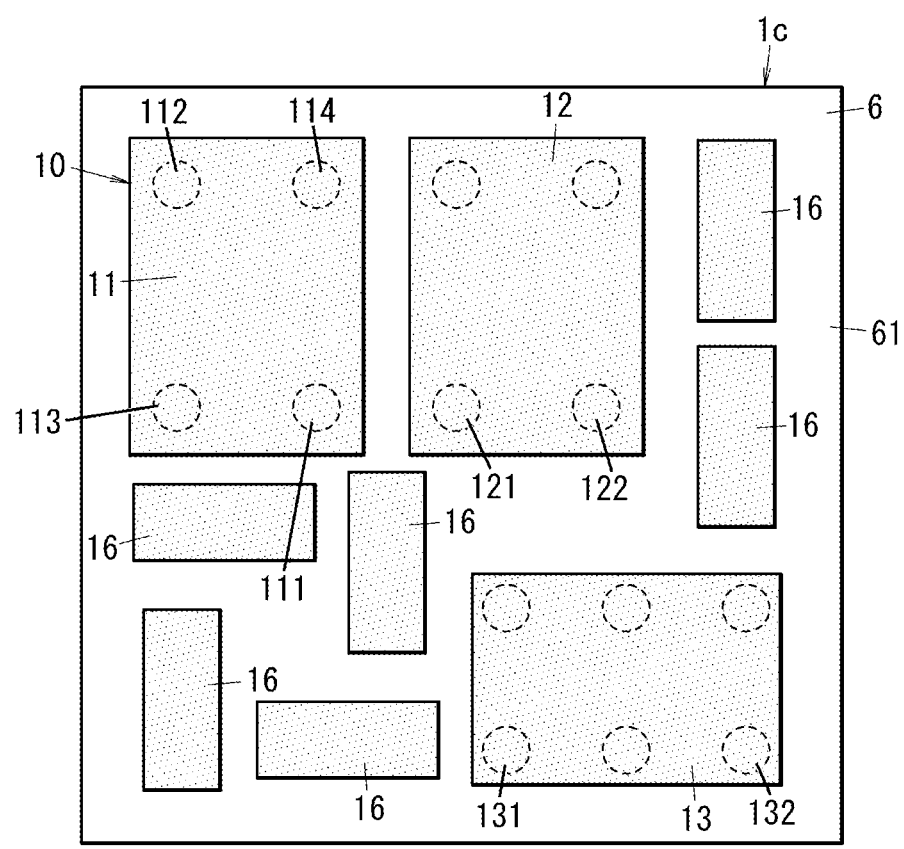
FIG. 22 is a plan view of a high-frequency module according to Embodiment 4.

A high-frequency module 1c according to Embodiment 4 will be described with reference to FIG. 22. With respect to the high-frequency module 1c according to Embodiment 4, the same constituent elements as those of the high-frequency module 1 according to Embodiment 1 are denoted by the same reference numerals, and the description thereof will be omitted. Note that the high-frequency module 1c according to Embodiment 4 can be used instead of the high-frequency module 1 of the communication device 300 according to Embodiment 1, for example.

The high-frequency module 1c according to Embodiment 4 is different from the high-frequency module 1 according to Embodiment 1 in that the first filter 11 and the second filter 12 are not provided as one package and are separated from each other.

In the high-frequency module 1c according to Embodiment 4, not only the filter characteristics of the first filter 11 can be improved, but also the degree of freedom in the arrangement of the first filter 11 and the second filter 12 is increased.

The high-frequency module 1c according to Embodiment 4 can be used, for example, instead of the high-frequency module 1 included in the high-frequency circuit 2 and the communication device 300 according to Embodiment 1 illustrated in FIG. 12.

Other Variations

Embodiments 1 to 4 described above are only one of various embodiments of the present disclosure. As long as the object of the present disclosure can be achieved, the above-described Embodiments 1 to 4 can be modified in various manners according to design and the like.

Further, the first filter 11, the second filter 12, and the third filter 13 are acoustic wave filters that utilize a surface acoustic wave, but the present disclosure is not limited thereto, and may be, for example, an acoustic wave filter that utilizes a boundary acoustic wave, a plate wave, or the like.

The first filter 11 may be a bare chip that does not have a package structure. Further, the first filter 11 is not limited to an acoustic wave filter using a surface acoustic wave, and may be, for example, a bulk acoustic wave (BAW) filter. Further, the first filter 11 is not limited to a ladder filter, and may be, for example, a longitudinally coupled resonator-type surface acoustic wave filter.

The piezoelectric substrate 110 of the first filter 11 is not limited to a piezoelectric substrate, and may be, for example, a laminated substrate including a piezoelectric layer.

The laminated substrate includes, for example, a support substrate, a low-acoustic-velocity film provided on the support substrate, and a piezoelectric layer provided on the low-acoustic-velocity film.

The support substrate has a first main surface and a second main surface that face each other. The low-acoustic-velocity film is provided on the first main surface of the support substrate.

The material of the piezoelectric layer is, for example, lithium tantalate or lithium niobate. The low-acoustic-velocity film is a film in which an acoustic velocity of the bulk wave propagating through the low-acoustic-velocity film is lower than an acoustic velocity of the bulk wave propagating through the piezoelectric layer. The material of the low-acoustic-velocity film is, for example, silicon oxide. The material of the low-acoustic-velocity film is not limited to silicon oxide. The material of the low-acoustic-velocity film may be, for example, silicon oxide, glass, silicon oxynitride, tantalum oxide, a compound obtained by adding fluorine, carbon, or boron to silicon oxide, or a material containing any of the above-described materials as a main component. In the support substrate, the acoustic velocity of the bulk wave propagating through the support substrate is higher than the acoustic velocity of the acoustic wave propagating through the piezoelectric layer. Here, the bulk wave propagating through the support substrate is a bulk wave having the lowest acoustic velocity among the plurality of bulk waves propagating through the support substrate. The material of the support substrate may include at least one kind of materials selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

The laminated substrate may further include a high-acoustic-velocity film provided between the support substrate and the low-acoustic-velocity film. The high-acoustic-velocity film is a film in which the acoustic velocity of the bulk wave propagating through the high-acoustic-velocity film is higher than the acoustic velocity of the acoustic wave propagating through the piezoelectric layer. The material of the high-acoustic-velocity film is, for example, at least one kind of materials selected from the group consisting of diamond-like carbon, aluminum nitride, aluminum oxide, silicon carbide, silicon nitride, silicon, sapphire, a piezoelectric body (lithium tantalate, lithium niobate, or crystal), alumina, zirconia, cordierite, mullite, steatite, forsterite, magnesia, and diamond. The material of the high-acoustic-velocity film may be a material containing any one of the materials described above, or a material containing a mixture containing any one of the above-described materials as a main component.

The laminated substrate may include, for example, a close contact layer interposed between the low-acoustic-velocity film and the piezoelectric layer. The close contact layer is made of, for example, resin (epoxy resin, polyimide resin). Further, the laminated substrate may include a dielectric film between the low-acoustic-velocity film and the piezoelectric layer, on the piezoelectric layer, or below the low-acoustic-velocity film. The material of the dielectric film is, for example, silicon oxide. Further, the first filter 11 may further include a protective film that is provided on the piezoelectric substrate 110 and covers the IDT electrodes 116. The material of the protective film is, for example, silicon oxide.

The high-frequency module 1 only needs to include at least the mounting substrate 6 and the first filter 11, and the second filter 12 and the third filter 13 (or the third filter 14) are optional.

The high-frequency circuit 2 only needs to have one of the transmission path including the power amplifier and the reception path including the low-noise amplifier in the first transmission/reception circuit 20, and the second transmission/reception circuit 30 and the third transmission/reception circuit 40 are optional.

Aspects

The following aspects are disclosed herein.

The high-frequency module (1; 1a; 1b; 1c) according to a first aspect includes a mounting substrate (6; 6a; 6b) and the filter (11). The mounting substrate (6; 6a; 6b) has the first main surface (61) and the second main surface (62) that face each other. The filter (11) includes the first input/output electrode (111) and the second input/output electrode (112), and is arranged on the first main surface (61) of the mounting substrate (6; 6a; 6b). The mounting substrate (6; 6a; 6b) has the first land electrode (611), the second land electrode (612), the ground terminal (623), and the plurality of via conductors (645). The first land electrode (611) is connected to the first input/output electrode (111). The second land electrode (612) is connected to the second input/output electrode (112). The ground terminal (623) is located closer to the second main surface (62) side than the first main surface (61) in the thickness direction (D1) of the mounting substrate (6; 6a; 6b). The plurality of via conductors (645) is arranged between the first main surface (61) and the second main surface (62) and is connected to the ground terminal (623). The plurality of via conductors (645) is located between the first land electrode (611) and the second land electrode (612) in a plan view from the thickness direction (D1) of the mounting substrate (6; 6a; 6b).

The high-frequency module (1; 1a; 1b; 1c) according to the first aspect can improve the filter characteristics.

In the high-frequency module (1; 1a; 1b; 1c) according to a second aspect, in the first aspect, the filter (11) includes a band pass filter having a predetermined pass band.

In the high-frequency module (1; 1a; 1b; 1c) according to a third aspect, in the second aspect, the predetermined pass band corresponds to a frequency band of the 2.4 GHz band of Wi-Fi®.

In the high-frequency module (1; 1a; 1b; 1c) according to a fourth aspect, in the second or third aspect, the filter (11) is a ladder filter having the plurality of series arm resonators (S1 to S5) and the plurality of parallel arm resonators (P1 to P4).

In the high-frequency module (1; 1a; 1b) according to the fourth aspect, it is possible to improve the attenuation characteristics.

The high-frequency module (1; 1a; 1b; 1c) according to a fifth aspect, in the fourth aspect, further includes the second filter (12) having a pass band on at least one of the low frequency side and the high frequency side of the predetermined pass band, separately from the first filter (11) which is the filter (11).

In the high-frequency module (1; 1a; 1b; 1c) according to the fifth aspect, when used as a multiplexer including the first filter (11) and the second filter (12), it is possible to suppress the influence of the filter characteristics of the first filter (11) on the filter characteristics of the second filter (12).

The high-frequency module (1; 1c) according to a sixth aspect, in the fifth aspect, further includes the third filter (13; 14) having a pass band on the higher frequency side or the lower frequency side than the predetermined pass band of the first filter (11) and the pass band of the second filter (12).

In the high-frequency module (1; 1c) according to the sixth aspect, when used as the multiplexer including the first filter (11), the second filter (12), and the third filter (13; 14), it is possible to suppress the influence of the filter characteristics of the first filter (11) on the respective filter characteristics of the second filter (12) and the third filter (13; 14).

In the high-frequency module (1; 1a; 1b; 1c) according to a seventh aspect, in any one of the second to sixth aspects, the distance between the two adjacent via conductors (645) among the plurality of via conductors (645) is equal to or less than one fourth of the wavelength of the radio wave at the center frequency of the predetermined pass band.

In the high-frequency module (1; 1a; 1b; 1c) according to the seventh aspect, it is possible to improve isolation between the first input/output electrode (111) and the second input/output electrode (112) of the filter (11).

In the high-frequency module (1; 1c) according to an eighth aspect, in any one of the first to seventh aspects, the mounting substrate (6) has a substantially polygonal shape in a plan view from the thickness direction (D1). One of the first land electrode (611) and the second land electrode (612) is arranged in the corner portion of the first main surface (61) of the mounting substrate (6) in a plan view from the thickness direction (D1).

In the high-frequency module (1; 1c) according to the eighth aspect, one land electrode (second land electrode 612) arranged in the corner portion of the first main surface (61) of the mounting substrate (6) out of the first land electrode (611) and the second land electrode (612) is less likely to be electromagnetically coupled to the other land electrode (first land electrode 611).

In the high-frequency module (1; 1a; 1b; 1c) according to a ninth aspect, in the first to eighth aspects, the mounting substrate (6; 6a; 6b) further includes the first wiring portion (641) connected to the first land electrode (611) and the second wiring portion (642) connected to the second land electrode (612). The plurality of via conductors (645) is located between the first wiring portion (641) and the second wiring portion (642) in a plan view from the thickness direction (D1) of the mounting substrate (6; 6a; 6b).

In the high-frequency module (1; 1a; 1b; 1c) according to the ninth aspect, the electromagnetic field coupling between the first wiring portion (641) and the second wiring portion (642) can be suppressed by the plurality of via conductors (645), and further improvement of the filter characteristics can be achieved.

In the high-frequency module (1; 1a; 1b; 1c) according to a tenth aspect, in the ninth aspect, at least a part of the first wiring portion (641) is located between the first main surface (61) and the second main surface (62) of the mounting substrate (6). At least a part of the second wiring portion (642) is located between the first main surface (61) and the second main surface (62) of the mounting substrate (6).

In the high-frequency module (1; 1a; 1b; 1c) according to the tenth aspect, it is possible to improve the filter characteristics of the filter (11).

In the high-frequency module (1; 1a; 1b; 1c) according to an eleventh aspect, in the ninth aspect, the mounting substrate (6; 6a; 6b) further includes the ground layer (651) connected to the plurality of via conductors (645) and the ground terminal (623). The ground layer (651) is located between the plurality of via conductors (645) and the ground terminal (623) in the thickness direction (D1). The ground layer (651) overlaps the plurality of via conductors (645) and the ground terminal (623) in a plan view from the thickness direction (D1).

In the high-frequency module (1; 1a; 1b; 1c) according to the eleventh aspect, a cross-sectional area of a cross-section orthogonal to the thickness direction (D1) of the mounting substrate (6; 6a; 6b) in the ground layer (651) to which the ground potential is applied can be increased. This makes it possible to reduce a resistance value of the ground layer (651) and to suppress the fluctuation in the potential of the ground terminal (623).

The high-frequency module (1; 1a; 1b; 1c) according to a twelfth aspect is based on the eleventh aspect. In the high-frequency module (1; 1a; 1b; 1c), the area of the ground layer (651) is larger than the area of the filter (11) in a plan view from the thickness direction (D1).

In the high-frequency module (1; 1a; 1b; 1c) according to the twelfth aspect, the filter characteristic is improved.

The high-frequency module (1; 1a; 1b; 1c) according to a thirteenth aspect, in the eleventh or twelfth aspect, further includes the via conductor (652) that is different from the plurality of via conductors (645), and is located between the ground layer (651) and the ground terminal (623) in the thickness direction (D1) to connect the ground layer (651) and the ground terminal (623).

In the high-frequency module (1; 1a; 1b; 1c) according to the thirteenth aspect, the degree of freedom in layout of the ground terminal (623) on the second main surface (62) of the mounting substrate (6; 6a; 6b) increases.

In the high-frequency module (1a; 1b) according to a fourteenth aspect, in the eleventh or twelfth aspect, the second wiring portion (642) includes the wiring via conductor (6421, 6423) arranged along the thickness direction (D1) and the inner-layer conductor portion (6422) arranged along a plane orthogonal to the thickness direction (D1). The mounting substrate (6) further includes the second ground layer (653) different from the first ground layer that is the ground layer (651). The second ground layer (653) is arranged between the first main surface (61) and the inner-layer conductor portion (6422). The second ground layer (653) overlaps the inner-layer conductor portion (6422) in a plan view from the thickness direction (D1) of the mounting substrate (6).

In the high-frequency module (1a; 1b) according to the fourteenth aspect, it is possible to improve isolation between the second wiring portion (642) and the first wiring portion (641), and to improve isolation between the first input/output electrode (111) and the second input/output electrode (112) of the filter (11).

In the high-frequency module (1b) according to a fifteenth aspect, in the fourteenth aspect, the mounting substrate (6) has four side surfaces (63, 64, 65, 66) connecting the first main surface (61) and the second main surface (62) to each other. The high-frequency module (1b) further includes two side ground layers (83, 84) that are respectively arranged on the two side surfaces (63, 64) close to the second wiring portion (642) out of the four side surfaces (63, 64, 65, 66) and are connected to the ground layer (651).

In the high-frequency module (1b) according to the fifteenth aspect, it is possible to further improve isolation between the first input/output electrode (111) and the second input/output electrode (112) of the filter (11).

The high-frequency circuit (2) according to a sixteenth aspect includes the high-frequency module (1; 1a; 1b; 1c) according to any one of the first to fifteenth aspects, and the amplifier (power amplifier 24, low-noise amplifier 25) connected to the filter (11) of the high-frequency modules (1; 1a; 1b; 1c).

In the high-frequency circuit (2) according to the sixteenth aspect, it is possible to improve the filter characteristics of the filter (11).

The communication device (300) according to a seventeenth aspect includes the high-frequency circuit (2) of the sixteenth aspect and the signal processing circuit (301). The signal processing circuit (301) performs signal processing on a high-frequency signal passing through the filter (11) of the high-frequency module (1; 1a; 1b; 1c).

In the communication device (300) according to the seventeenth aspect, it is possible to improve the filter characteristics of the filter (11).

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A high-frequency module comprising:
a mounting substrate having a first main surface and a second main surface facing each other; and
a filter having a first input/output electrode and a second input/output electrode, the filter being on the first main surface of the mounting substrate,
wherein the mounting substrate comprises:
a first land electrode connected to the first input/output electrode;
a second land electrode connected to the second input/output electrode;
a ground terminal that is closer to the second main surface of the mounting substrate than the first main surface of the mounting substrate, in a thickness direction of the mounting substrate; and
a plurality of via conductors that are between the first main surface of the mounting substrate and the second main surface of the mounting substrate and that are connected to the ground terminal, the plurality of via conductors being between the first land electrode and the second land electrode when the mounting substrate is seen in a plan view from the thickness direction.

2. The high-frequency module according to claim 1, wherein the filter comprises a band pass filter having a predetermined pass band.

3. The high-frequency module according to claim 2, wherein the predetermined pass band corresponds to a 2.4 GHz band of Wi-Fi.

4. The high-frequency module according to claim 2, wherein the filter is a ladder filter comprising a plurality of series arm resonators and a plurality of parallel arm resonators.

5. The high-frequency module according to claim 4, further comprising a second filter having a pass band on a low frequency side or a high frequency side of the predetermined pass band.

6. The high-frequency module according to claim 5, further comprising a third filter having a pass band on a high frequency side or a low frequency side of the predetermined pass band of the first filter and the pass band of the second filter.

7. The high-frequency module according to claim 2, wherein a distance between two adjacent via conductors of the plurality of via conductors is equal to or less than one fourth of a wavelength of a radio wave at a center frequency of the predetermined pass band.

8. The high-frequency module according to claim 1,
wherein the mounting substrate has a polygonal shape when seen in the plan view from the thickness direction, and
wherein the first land electrode or the second land electrode is at a corner portion of the first main surface of the mounting substrate when the mounting substrate is seen in the plan view from the thickness direction.

9. The high-frequency module according to claim 1,
wherein the mounting substrate further comprises:
a first wiring portion connected to the first land electrode; and
a second wiring portion connected to the second land electrode, and
wherein the plurality of via conductors are between the first wiring portion and the second wiring portion when the mounting substrate is seen in the plan view from the thickness direction.

10. The high-frequency module according to claim 9,
wherein at least a part of the first wiring portion is between the first main surface and the second main surface of the mounting substrate, and
wherein at least a part of the second wiring portion is between the first main surface and the second main surface of the mounting substrate.

11. The high-frequency module according to claim 9,
wherein the mounting substrate further comprises a ground layer connected to the plurality of via conductors and to the ground terminal,
wherein the ground layer is between the plurality of via conductors and the ground terminal in the thickness direction, and
wherein the ground layer overlaps the plurality of via conductors and the ground terminal when the mounting substrate is seen in the plan view from the thickness direction.

12. The high-frequency module according to claim 11, wherein an area of the ground layer is larger than an area of the filter when the mounting substrate is seen in the plan view from the thickness direction.

13. The high-frequency module according to claim 11, further comprising a second via conductor that is different from the plurality of via conductors, and that is between the ground layer and the ground layer in the thickness direction,
wherein the second via conductor connects the ground layer and the ground terminal.

14. The high-frequency module according to claim 11,
wherein the second wiring portion comprises a second via conductor along the thickness direction, and an inner-layer conductor portion along a plane orthogonal to the thickness direction,
wherein the mounting substrate further comprises a second ground layer different from the ground layer, and
the second ground layer is between the first main surface and the inner-layer conductor portion, and overlaps the inner-layer conductor portion when the mounting substrate is seen in the plan view from the thickness direction.

15. The high-frequency module according to claim 14,
wherein the mounting substrate has four side surfaces connecting the first main surface and the second main surface, and
wherein the high-frequency module further comprises two side ground layers that are respectively arranged on two side surfaces that are closest to the second wiring portion, and that are connected to the ground layer.

16. A high-frequency circuit comprising:
the high-frequency module according to claim 1; and
an amplifier connected to the filter of the high-frequency module.

17. A communication device comprising:
the high-frequency circuit according to claim 16; and
a signal processing circuit configured to perform signal processing on a high-frequency signal passing through the filter of the high-frequency module.

* * * * *